(12) United States Patent
Zhan et al.

(10) Patent No.: US 9,018,071 B2
(45) Date of Patent: *Apr. 28, 2015

(54) METHODS FOR FORMING ELECTROSTATIC DISCHARGE PROTECTION CLAMPS WITH INCREASED CURRENT CAPABILITIES

(71) Applicant: Freescale Semiconductor Inc., Austin, TX (US)

(72) Inventors: Rouying Zhan, Gilbert, AZ (US); Amaury Gendron, San Jose, CA (US); Chai Ean Gill, Chandler, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/168,807

(22) Filed: Jan. 30, 2014

(65) Prior Publication Data

US 2014/0235026 A1 Aug. 21, 2014

Related U.S. Application Data

(62) Division of application No. 13/770,548, filed on Feb. 19, 2013, now Pat. No. 8,647,955.

(51) Int. Cl.
| | |
|---|---|
| *H01L 21/8222* | (2006.01) |
| *H01L 23/62* | (2006.01) |
| *H01L 21/8228* | (2006.01) |
| *H01L 27/02* | (2006.01) |
| *H01L 29/66* | (2006.01) |

(52) U.S. Cl.
CPC ........ *H01L 21/8228* (2013.01); *H01L 27/0259* (2013.01); *H01L 29/66234* (2013.01)

(58) Field of Classification Search
CPC .................... H01L 21/823487; H01L 27/0259
USPC .......... 257/173, 361, 582, 592; 438/329–337, 438/331
See application file for complete search history.

(56) References Cited

U.S. PATENT DOCUMENTS 6,927,442 B2    8/2005   Kaneko et al.
7,303,968 B2   12/2007   Dunn et al.
(Continued)

OTHER PUBLICATIONS

USPTO, Non-Final Office Action for U.S. Appl. No. 13/561,990, mailed Mar. 12, 2014.
(Continued)

*Primary Examiner* — Calvin Lee
(74) *Attorney, Agent, or Firm* — Ingrassia Fisher & Lorenz, P.C.

(57) ABSTRACT

Methods for forming an electrostatic discharge protection (ESD) clamps are provided. In one embodiment, the method includes forming at least one transistor having a first well region of a first conductivity type extending into a substrate. At least one transistor is formed having another well region of a second opposite conductivity type, which extends into the substrate to partially form a collector. The lateral edges of the transistor well regions are separated by a distance D, which at least partially determines a threshold voltage Vt1 of the ESD clamp. A base contact of the first conductivity type is formed in the first well region and separated from an emitter of the second conductivity type by a lateral distance Lbe. The first doping density and the lateral distance Lbe are selected to provide a parasitic base-emitter resistance Rbe in the range of $1 < Rbe < 800$ Ohms.

20 Claims, 13 Drawing Sheets

(56) References Cited

U.S. PATENT DOCUMENTS

| | | |
|---|---|---|
| 8,242,566 B2 | 8/2012 | Zhan et al. |
| 8,390,071 B2 * | 3/2013 | Zhan et al. .................... 257/361 |
| 8,647,955 B2 * | 2/2014 | Zhan et al. .................... 438/331 |
| 2001/0015470 A1 | 8/2001 | Gregory |
| 2002/0030244 A1 | 3/2002 | Pruijmboom et al. |
| 2006/0220137 A1 | 10/2006 | Kuroda et al. |
| 2007/0278515 A1 | 12/2007 | Hurst |
| 2008/0044955 A1 | 2/2008 | Salcedo et al. |
| 2010/0044823 A1 | 2/2010 | Rafferty et al. |
| 2010/0044834 A1 | 2/2010 | Park et al. |
| 2011/0101444 A1 | 5/2011 | Coyne et al. |

OTHER PUBLICATIONS

USPTO, Notice of Allowance and Fee(s) Due for U.S. Appl. No. 13/561,990, mailed Sep. 4, 2014.

USPTO, Response to Non-Final Office Action for U.S. Appl. No. 13/561,990, mailed Jun. 12, 2014.

* cited by examiner

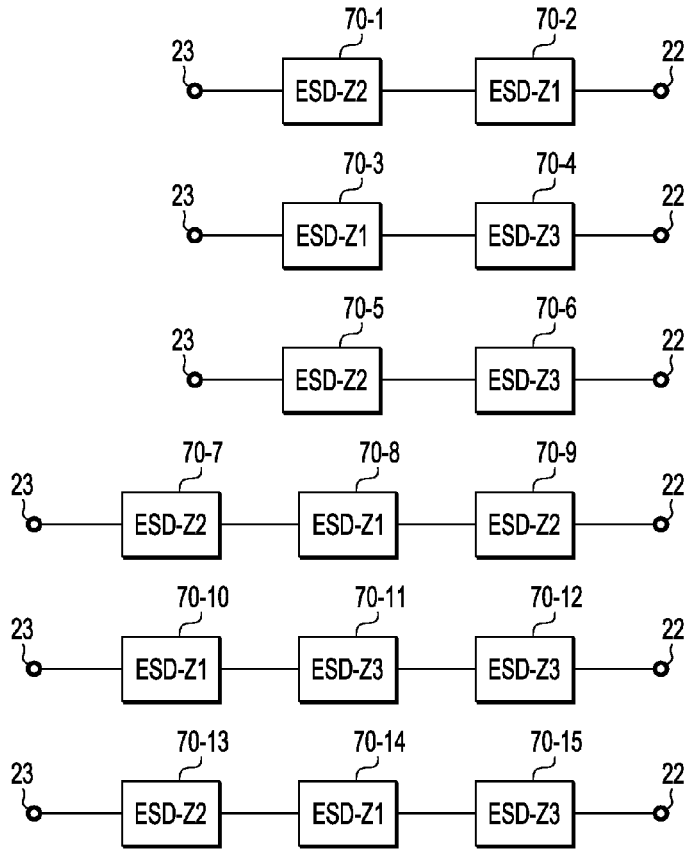
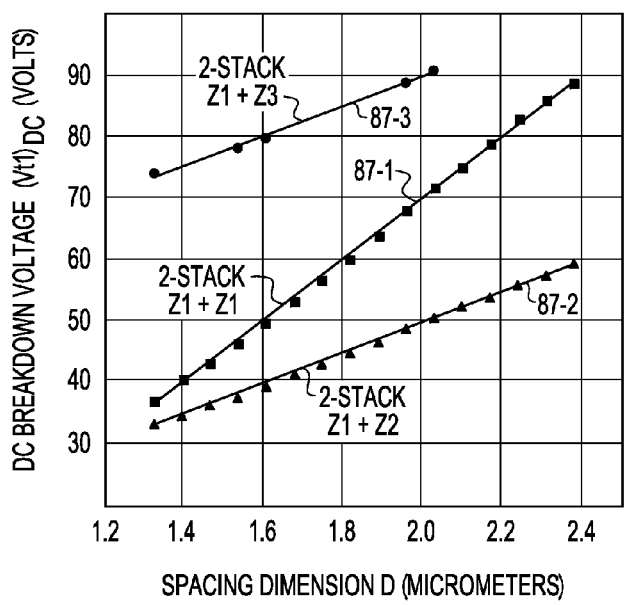

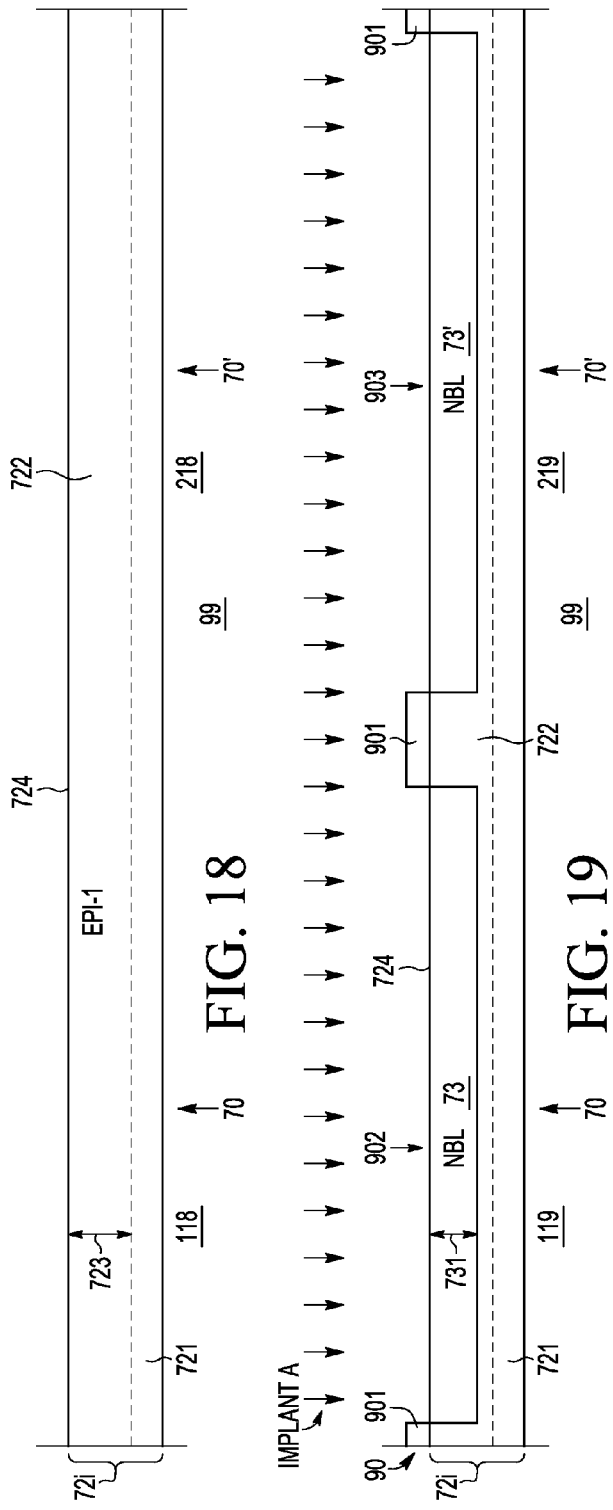

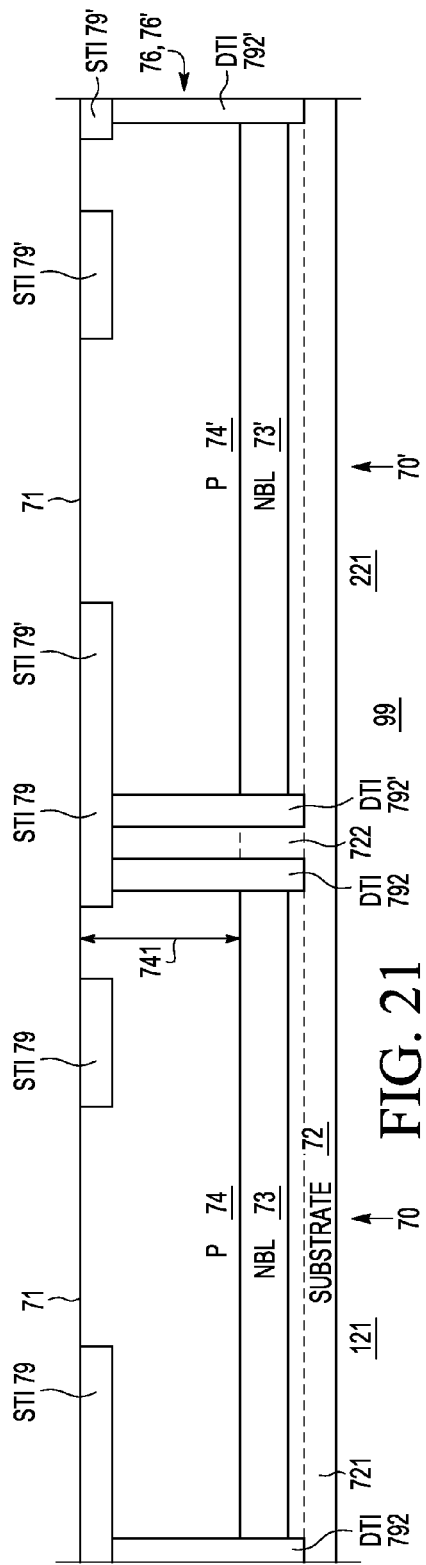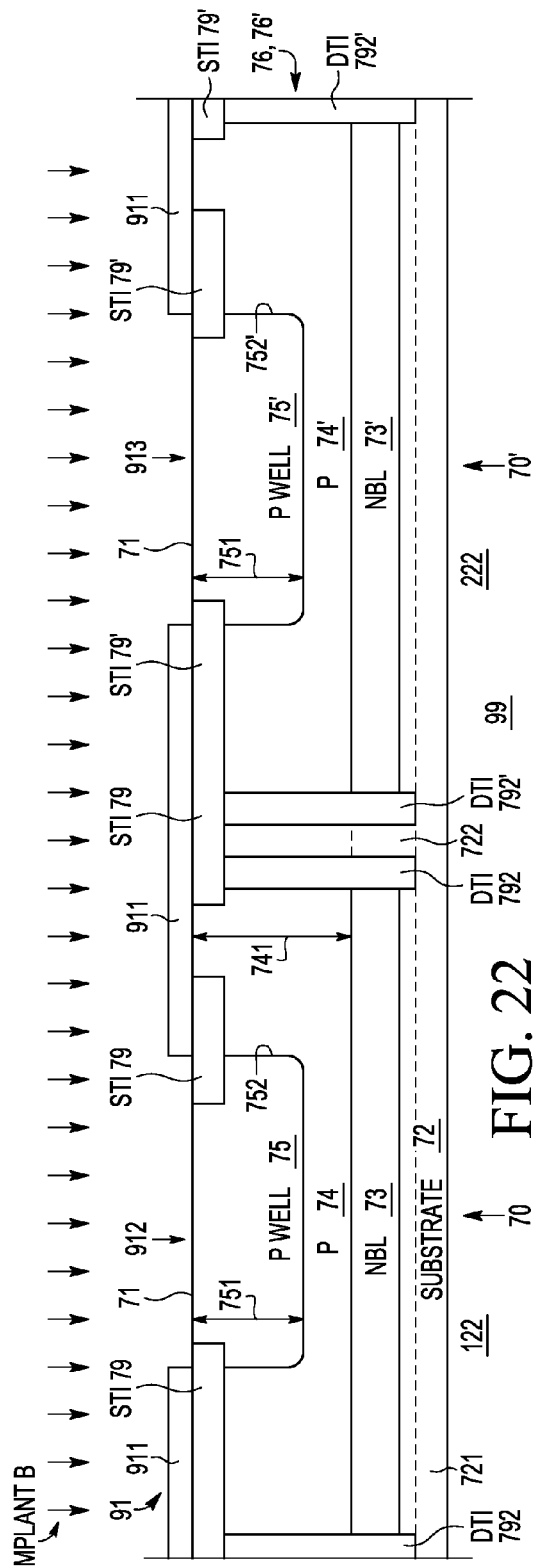

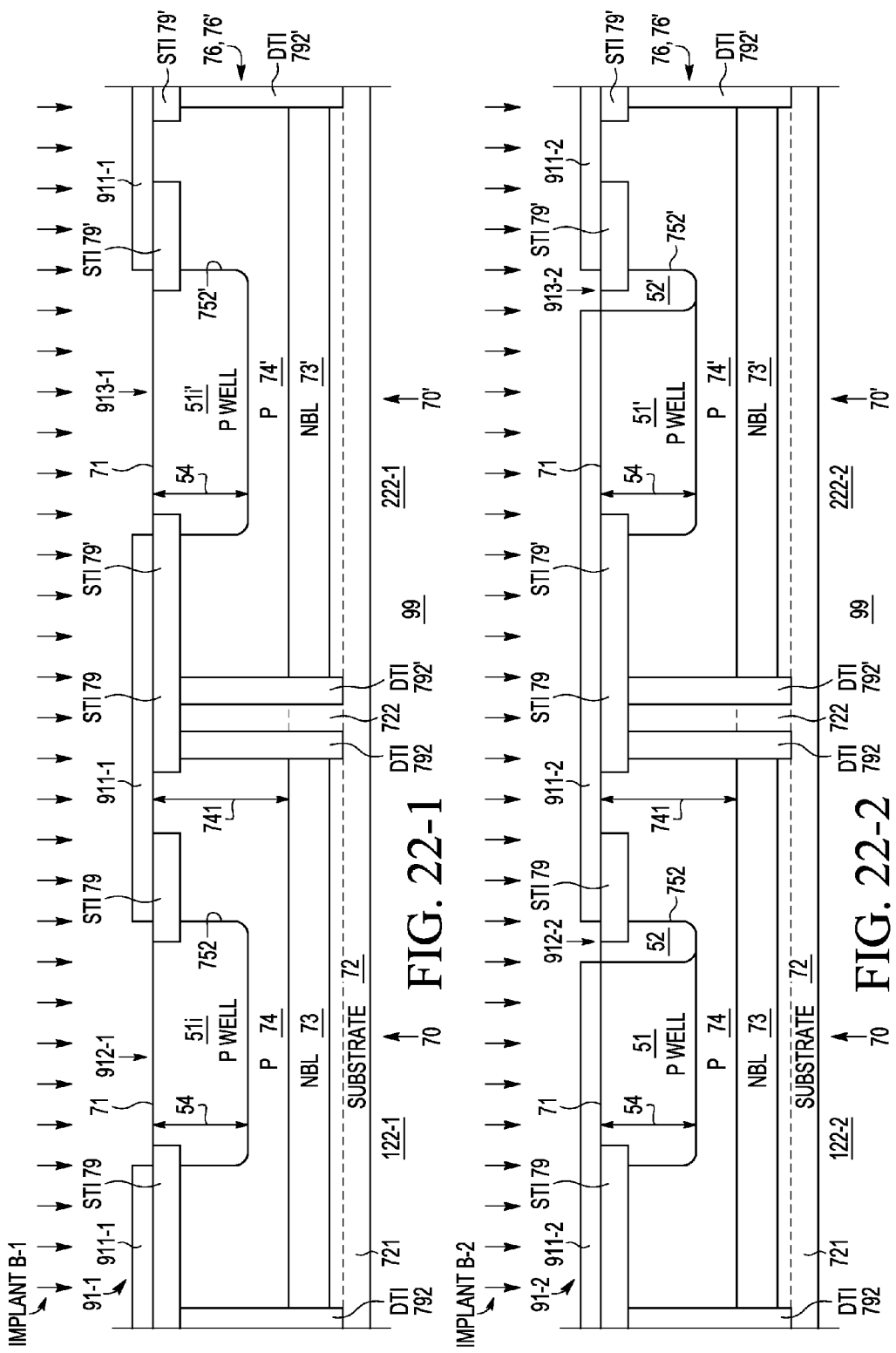

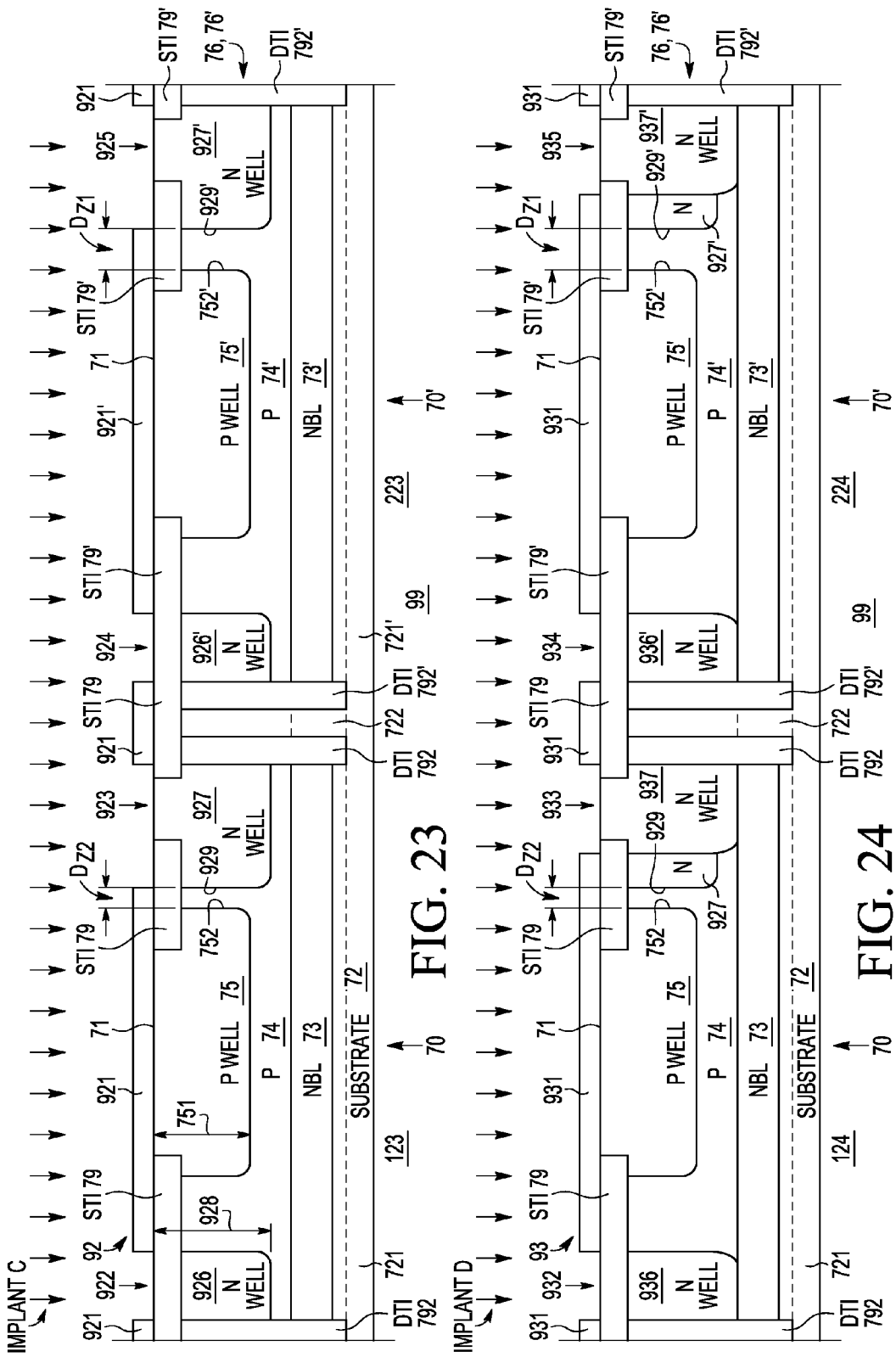

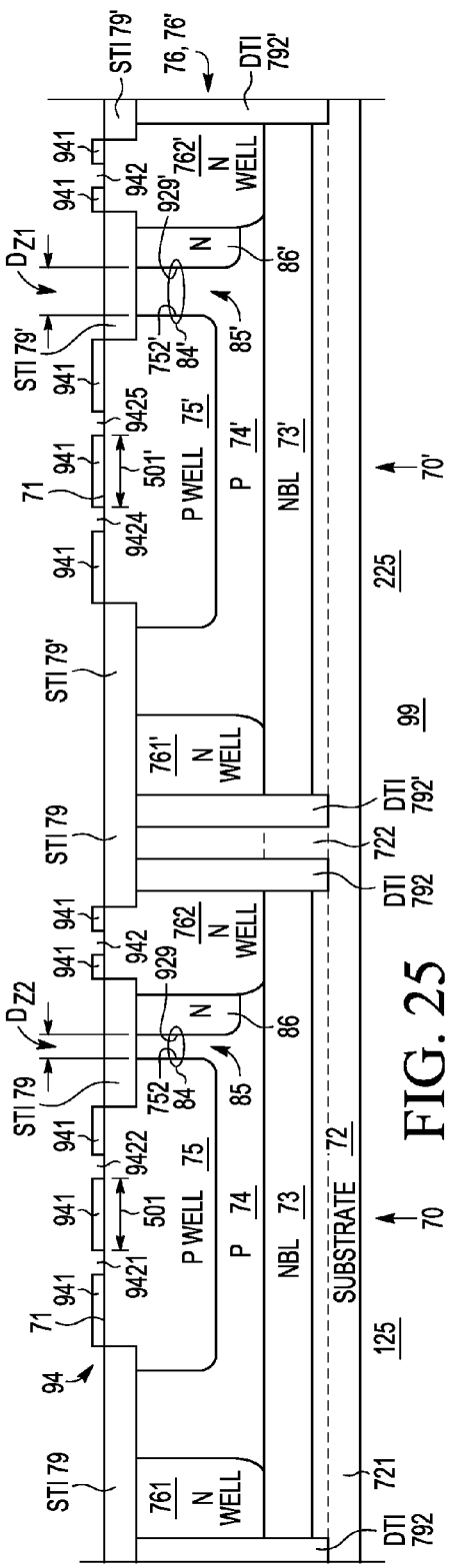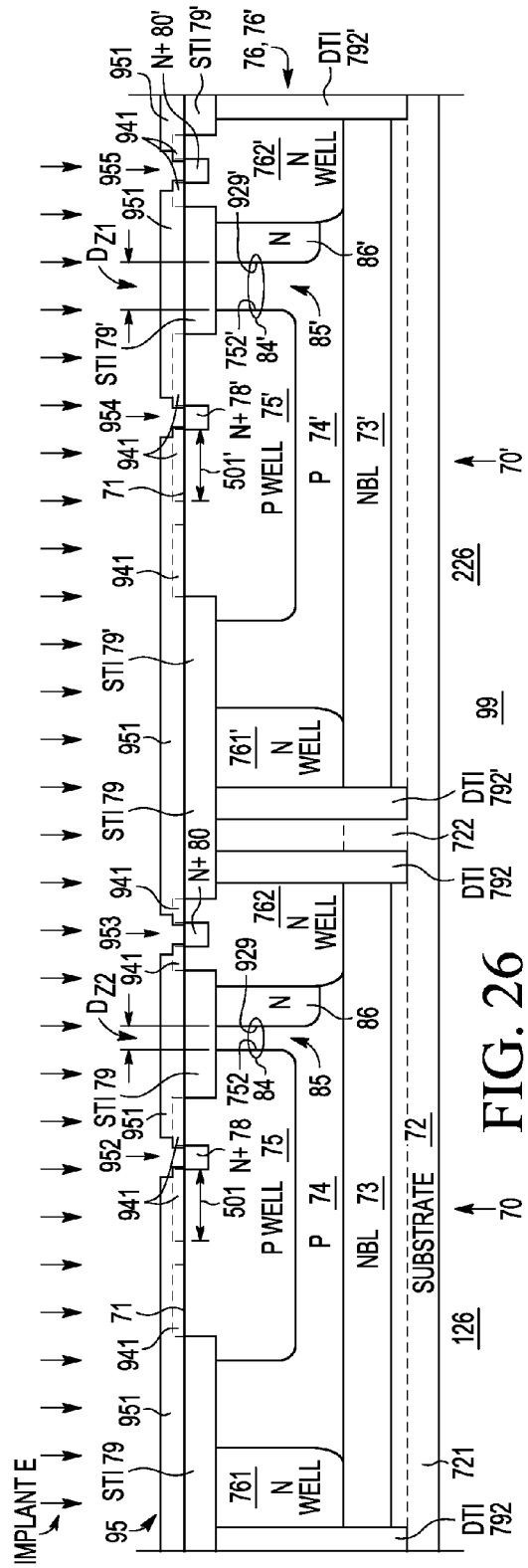

METHODS FOR FORMING ELECTROSTATIC DISCHARGE PROTECTION CLAMPS WITH INCREASED CURRENT CAPABILITIES

CROSS-REFERENCES TO RELATED APPLICATIONS

This application is a continuation of U.S. application Ser. No. 13/770,548, filed Feb. 19, 2013, now U.S. Pat. No. 8,647,955, issued Feb. 11, 2014; which is a divisional of U.S. application Ser. No. 12/956,686, filed Nov. 30, 2010, now U.S. Pat. No. 8,390,071, issued Mar. 5, 2013; which is a continuation-in-part of U.S. application Ser. No. 12/689,666, filed Jan. 19, 2010, now U.S. Pat. No. 8,242,566, issued Aug. 14, 2012.

FIELD OF THE INVENTION

The present invention generally relates to semiconductor devices, and, more particularly, to semiconductor devices used for electrostatic discharge (ESD) protection in integrated and other circuits, and to methods for fabricating such semiconductor devices.

BACKGROUND OF THE INVENTION

Modern integrated circuits (ICs) and the devices therein are at risk of damage due to electrostatic discharge (ESD) events. This is well known in the art. Accordingly, it is commonplace to provide an ESD clamp (voltage limiting device) across the input and/or other terminals of such devices and IC's. FIG. 1 is a simplified schematic diagram of circuit 20 wherein ESD clamp 21 is placed, for example, between input-output (I/O) terminal 22 and ground or common terminal 23 of an IC to protect other devices on the chip, that is, to protect "circuit core" 24 also coupled to I/O and common terminals 22, 23. Person of skill in the art will understand that ESD clamp 21 may be placed across any terminals of the IC or other device or circuit, and reference herein to I/O terminals is intended to include any and all other terminals not merely those used for input or output signals. Further, the Zener diode illustrated in block 21 of FIG. 1 is merely for convenience of identifying the voltage limiting function of ESD block 21 and not intended to imply that a Zener diode is present therein.

FIG. 2 is a simplified schematic diagram illustrating internal components of ESD clamp 21 utilizing bipolar transistor 25, having emitter 26, collector 27, base 28, and internal resistance 29. When the voltage across terminals 22, 23 rises beyond a predetermined limit, bipolar transistor 25 turns on, limiting the voltage across terminals 22, 23, desirably to a level below that capable of damaging circuit core 24.

FIG. 3 shows simplified plot 30 of transmission line pulse current (I) versus voltage (V) for a typical electrostatic discharge (ESD) protection device such as, for example, the device of FIG. 2. As the applied voltage is increased, very little current flows until triggering voltage 31 is reached at voltage Vt1. Once triggered into operation, the ESD device conducts and the current increases to holding point 32 with current Ih and voltage Vh. Depending upon the internal impedance of the voltage source, current and voltage may further increase to point 33 at current It2 and voltage Vt2, beyond which destructive failure may occur leading to further current increase accompanied by voltage decrease. It2 is also referred to as the damage onset current threshold.

Electrostatic discharge (ESD) protection devices are intended to remain quiescent during normal operation of the associated semiconductor (SC) device(s) or non-SC device(s) or integrated circuit (IC) (i.e., the protected element(s) of circuit core 24) having a normal operating voltage Vo, but turn on when excessive voltage arises, thereby preventing damage to the protected element(s). The triggering voltage Vt1 of the ESD device should exceed the maximum normal DC operating voltage Vo(MAX) of the protected elements; otherwise the ESD device will interfere with normal operation of the protected elements. Further, Vt1 should be less than, for example, a voltage $V_{TR}$ (usually a transient voltage) large enough to damage the protected element(s), hereafter referred to as the protected element break-down voltage, abbreviated as $V_{TR}$(PEBD). Thus, the ESD device should be designed so that Vo(MAX)<Vt1<$V_{TR}$(PEBD).

BRIEF DESCRIPTION OF THE DRAWINGS

The present invention will hereinafter be described in conjunction with the following drawing figures, wherein like numerals denote like elements, and wherein:

FIGS. 6-7 are simplified schematic diagrams of serially cascaded (e.g., stacked) ESD transistors of the type illustrated in FIG. 4 but with spacing dimensions D limited to zone Z1 of FIG. 5, wherein FIG. 6 shows a 2-stack and FIG. 7 shows a 3-stack;

FIGS. 10-15 show simplified schematic diagrams of serially cascaded stacks of ESD transistors, wherein FIGS. 10-12 show 2-stack combinations and FIGS. 13-15 show 3-stack combinations, according to still further embodiments of the present invention;

FIG. 16 is a simplified plot of DC breakdown voltage in volts as a function of lateral base-collector spacing dimension D in micrometers for different 2-stacks of cascaded ESD transistors, comparing the results for 2-stacks having different dimensions D within the stack according to yet further embodiments of the present invention;

FIGS. 18-22 are simplified cross-sectional views of an ESD clamp of the type illustrated in FIG. 9 during various stages 118-122 of manufacture according to still yet further embodiments of the present invention and showing additional detail;

FIGS. 22-1 and 22-2 are simplified cross-sectional views of an ESD clamp of the type illustrated in FIG. 9 showing variations of manufacturing stage 122 of FIG. 22, according to other embodiments of the present invention and showing additional detail;

FIGS. 23-28 are simplified cross-sectional views of an ESD clamp of the type illustrated in FIG. 9 during various stages 123-128 of manufacture according to still other embodiments of the present invention and showing additional detail.

DETAILED DESCRIPTION OF THE INVENTION

Figure 1:
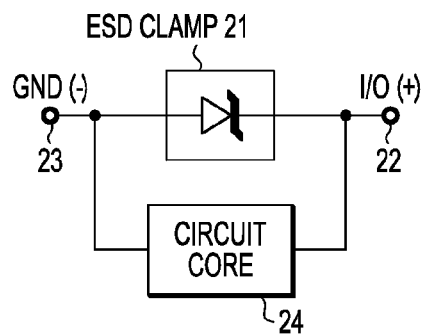
FIG. 1 is a simplified schematic diagram of a circuit wherein an ESD clamp is placed between an input-output (I/O) terminal and a ground or common terminal of an IC or other circuit to protect other devices on the chip, that is, the "circuit core" coupled to the I/O terminals.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" is intended to include any semiconductor whether single crystal, poly-crystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures as for example and not intended to be limiting, semiconductor-on-insulator (SOI) structures, and combinations thereof. The term "semiconductor" is abbreviated as "SC." For convenience of explanation and not intended to be limiting, semiconductor devices and methods of fabrication are described herein for silicon semiconductors but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type" where the first type may be either N or P type and the second type then is either P or N type.

In order to be able to build ESD devices that have different Vt1 values to meet the protection needs of different core circuits 24 (see FIG. 1), it is common to design ESD devices such that Vt1 depends upon the spacing of a particular device dimension. For example, bipolar transistor 25 of FIG. 2 is often a lateral transistor wherein Vt1 depends upon a base-collector spacing dimension D. Transistor 40 of FIG. 4 (described below) illustrates a lateral transistor having base-collector spacing dimension D. One of the difficulties of using bipolar transistors such as bipolar transistor 25, 40 in ESD applications is that there can be significant variation ΔD in base-collector spacing dimension D across a SC wafer and/or SC die as a function, for example, of the azimuthal orientation of transistor 25, 40 on the wafer or die. In addition, the spacing dimension D can have significant variation ΔD from one wafer to another, e.g. between manufacturing different lots. This has the result that Vt1 of nominally identical devices can be different in different regions of the same IC and from manufacturing lot to manufacturing lot, depending, for example, on their relative azimuthal orientation on the IC die or wafer. This Vt1 variation can adversely affect overall manufacturing yield and is not desirable. Various process modifications may be used to minimize such effect, but such modifications are often accompanied by an undesirable increase in manufacturing cost or other difficulties. The Vt1 variation can become especially acute when such ESD clamp transistors are cascaded, that is, serially coupled in stacks in order to obtain higher vales of Vt1 than can be provided by single ESD clamp transistor 25, 40.

There is an ongoing need to provide improved ESD clamps that operate at more consistent trigger voltages Vt1 independent of their location or orientation on a particular IC, especially stacks of ESD clamps adapted to provide higher values of Vt1 than can be obtained with single ESD transistor 25. Additionally, it is desirable that the current handling capabilities of the ESD clamps, for example the damage onset current threshold It2, be made as large as possible for a given ESD device area and trigger voltage. Further, it is desirable that the improved ESD clamps be obtainable without significant modification of the manufacturing process used for forming the clamps and the associated circuit core of the IC. Furthermore, other desirable features and characteristics of the present invention will become apparent from this detailed description of the invention and the appended claims herein, taken in conjunction with the accompanying drawings and the background of the invention.

Figure 4:
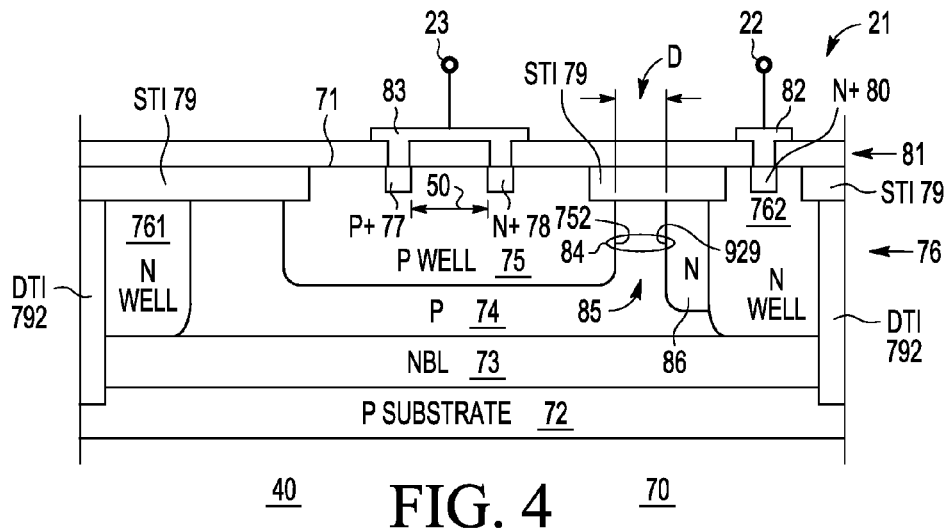
FIG. 4 shows a simplified cross-sectional view of an ESD clamp implemented in a semiconductor substrate and suitable for use in the circuits of FIGS. 1-2, according to an embodiment of the present invention.

FIG. 4 shows a simplified cross-sectional view of ESD clamp transistor 40, 70 implemented in semiconductor substrate 72 according to an embodiment of the present invention. Transistor 40, 70 fulfills the function of transistor 25 in FIG. 2 and ESD clamp 21 in FIG. 1. Transistor 40, 70 is formed in substrate 72 (e.g. P) having upper surface 71 and with N type buried layer (NBL) region 73 therein. Overlying NBL 73 is region 74 (e.g., P) extending from NBL 73 to surface 71 and within which are formed shallow trench isolation (STI) regions 79, deep trench isolation (DTI) regions 792, N WELL regions 761, 762 (collectively 76) with contact region 80 (e.g., N+) and P WELL region 75. Doped contact region 77 (e.g., P+) is provided in P WELL region 75 to make Ohmic contact to P WELL region 75. P WELL region 75 is generally somewhat more heavily doped than P region 74. Doped region 78 (e.g., N+) in P WELL region 75 serves as the emitter, P WELL region 75 (with portion 85 of P region 74) serves as the base, and N WELL region 86, 762 with N+ contact region 80 serves as the collector of transistor 40, 70. Doped region 77 (e.g., the base contact region) and emitter 78 are separated by lateral distance 50, also referred to as lateral base-emitter (Lbe) spacing 50. Dielectric layer 81 is conveniently provided on surface 71 with openings therein extending to base contact region 77, emitter 78 and collector contact region 80. Conductor 82 makes Ohmic contact to collector contact region 80, and conductor 83 makes Ohmic contact to base contact region 77 and emitter 78, connecting regions 77, 78 together. Conductor 82 of transistor 40, 70 is conveniently coupled to terminal 22 and conductor 83 of transistor 40, 70 is conveniently coupled to terminal 23 of ESD circuit 20. Further N region 86 is provided in Ohmic contact with N WELL region 762. Base-collector spacing dimension D is determined by the lateral separation between boundary 752 of P Well (e.g., base) region 75 and boundary 929 of further N region 86, wherein avalanche breakdown region 84 spans portion 85 of P region 74 between boundary 752 of P WELL base region 75 and boundary 929 of further N region 86. The relative doping of the various regions is discussed in more detail later. The convention is generally followed hereafter wherein reference number 40 is used to identify transistors that have base-collector spacing dimensions D limited to central zone Z1 of FIG. 5 and reference number 70 is used to refer to transistors that have base-collector spacing dimensions D from any of zones Z1, Z2, Z3 of FIG. 5.

Figure 5:
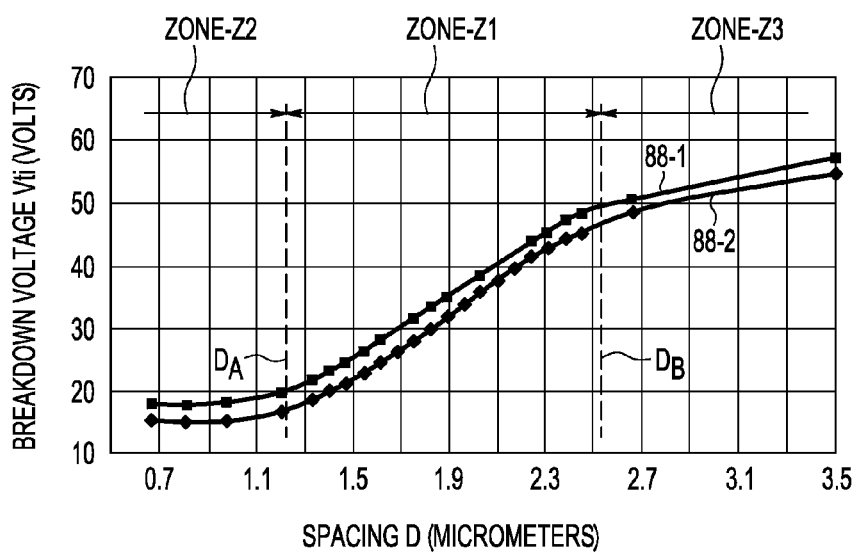
FIG. 5 is a simplified plot of DC breakdown voltage in volts as a function of lateral base-collector spacing dimension D in micrometers for the device of FIG. 4 over an extended range of spacing dimensions D.

FIG. 5 shows simplified plot 88 of AC breakdown voltage $Vt1_{AC}$ (trace 88-1) and DC breakdown voltage $Vt1_{DC}$ (trace 88-2) in volts as a function of lateral base-collector spacing dimension D in micrometers for device 40, 70 of FIG. 4 over an extended spacing range, in this example, from D less than about 0.7 micrometers to D of about 3.5 micrometers. It will be noted that the values of $Vt1_{AC}$ (trace 88-1) and $Vt1_{DC}$ (trace 88-2) are close together and have substantially identical slopes ($\Delta Vt1/\Delta D$). Plot 88 of FIG. 5 may be divided into three zones: (1) central Zone-Z1, (2) leftward peripheral Zone-Z2, and (3) rightward peripheral Zone-Z3. Zone Z1 has spacing dimensions $D_{Z1}$ corresponding to $D_A < D_{Z1} < D_B$, zone Z2 has spacing dimensions $D_{Z2}$ corresponding to $D_{Z2} \leq D_A$ and zone Z3 has spacing dimensions $D_{Z3}$ corresponding to $D_{Z3} \geq D_B$. In this example $D_A$ is about 1.2-1.3 micrometers and $D_B$ is about 2.4-2.5 micrometers, but different values may be obtained in other embodiments. Central zone Z1 corresponds to trace 61 for single ESD-Z1 device 40 of FIG. 8. Vt1 varies approximately linearly with spacing dimension $D_{Z1}$ in central zone Z1 with slope $(\Delta Vt1/\Delta D)_{Z1}$ (for both AC and DC) of about 25 volts per micrometer. It will be noted that slope $(\Delta Vt1/\Delta D)_{Z2}$ of Vt1 versus D in zone Z2, and also slope $(\Delta Vt1/\Delta D)_{Z3}$, of Vt1 versus D in zone Z3 are significantly smaller than slope $(\Delta Vt1/\Delta D)_{Z1}$ in zone Z1. For example, slope $(\Delta Vt1/\Delta D)_{Z2}$ has a value of about 0 to 3 volts per micrometers and slope $(\Delta Vt1/\Delta D)_{Z3}$ has a value of about 0 to 9 volts per micrometer, as compared with the above-noted value for slope $(\Delta Vt1/\Delta D)_{Z1}$ of about 25 volts per micrometer. Stated another way, the slope of region Z1 is at least 2 or more times greater than the slope of regions Z2 or Z3. It has been found that these differences in Vt1 versus D sensitivity among Zones Z1 to Z3 can be used to provide stacked ESD devices with reduced sensitivity to variations $\Delta D$ in spacing dimension D.

Figure 6:
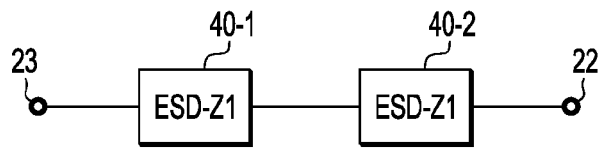
Figure 7:
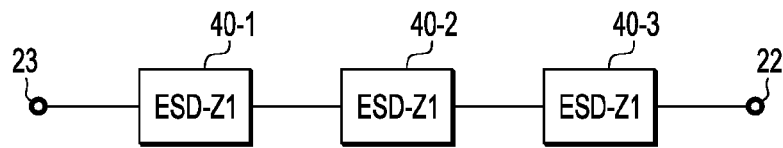
Figure 8:
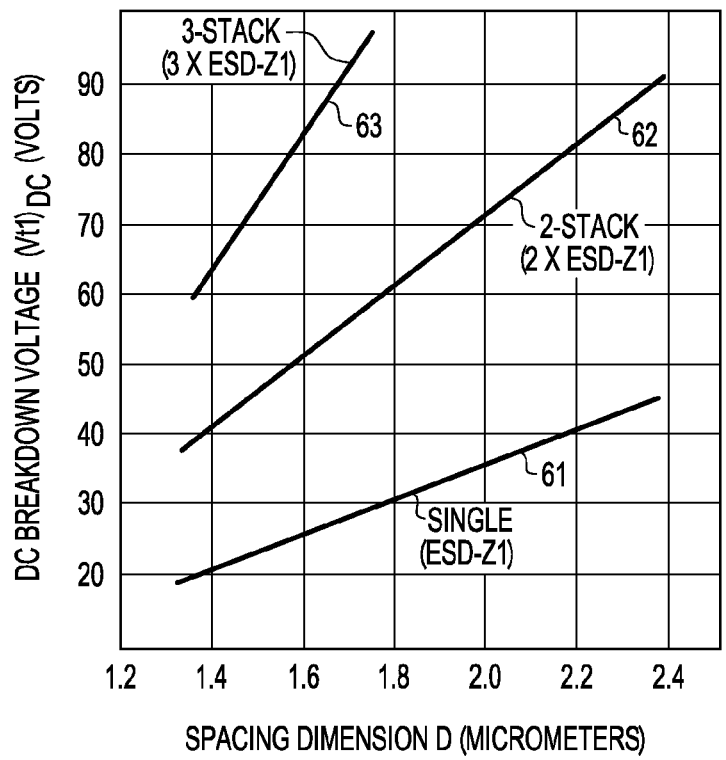
FIG. 8 is a simplified plot of DC breakdown voltage in volts as a function of lateral base-collector spacing dimension D in micrometers for different numbers of serially cascaded (stacked) ESD transistors of the type illustrated in FIG. 4 with spacing dimension D limited to zone Z1 of FIG. 5.

FIGS. 6-7 are simplified schematic diagrams of ESD clamps 65, 66 comprising serially cascaded (e.g., stacked) ESD transistors 40 of FIG. 4 all with spacing dimension D from zone Z1 of FIG. 5. FIG. 6 shows 2-stack clamp 65 and FIG. 7 shows 3-stack clamp 66. Stated another way, 2-stack ESD clamp 65 comprises two series coupled devices or transistors 21, 25 of FIGS. 1-2, wherein terminal 22 of the first transistor is coupled to terminal 23 of the second transistor, and terminal 23 of the first transistor and terminal 22 of the serially cascaded second transistor are coupled across core circuit 24, wherein transistors 40 fulfill the function of devices or transistors 21, 25 with the spacing dimensions D as noted above. Analogously, 3-stack clamp 66 comprises three serially cascaded devices 40 coupled across circuit core 24. FIG. 8 is a simplified plot of DC breakdown voltage $Vt1_{DC}$ in volts as a function of lateral base-collector spacing dimension D in micrometers, for different numbers of serially cascaded (stacked) ESD transistors 40 with base-collector spacing dimension D from zone Z1 of FIG. 5. The designation "ESD-Z1" is used to identify transistors 40 of FIG. 4 used in stacked clamp 65 and 66, indicating that they individually have the $Vt1_{DC}$ versus D characteristics illustrated by trace 61 of FIG. 8 for single ESD transistor 25, 40 with D chosen from zone Z1 of FIG. 5. Trace 61 for single type ESD-Z1 transistor shows a sensitivity of $Vt1_{DC}$ to spacing dimension D of about 25 volts per micrometer, which is substantially linear over the range from about 1.3 to about 2.4 micrometers of base-collector spacing dimension D. Accordingly, to obtain a desired value of $Vt1_{DC}$ (and the closely related value of $Vt1_{AC}$) one builds single transistor 25, 40 with the corresponding abscissa value of spacing dimension D for the desired value of $Vt1_{DC}$ shown on the ordinate. Trace 61 for single type ESD-Z1 device with slope $(\Delta Vt1_{DC}/\Delta D)$ of about 25 volts per micrometer corresponds to central region Z1 of FIG. 5.

Trace 62 of FIG. 8 illustrates the variation of DC breakdown voltage $Vt1_{DC}$ as a function of spacing dimension D of 2-stack clamp 65 of FIG. 6 wherein each transistor 40-1, 40-2 is of type ESD-Z1 illustrated in FIG. 4 and individually having the properties illustrated by trace 61 of FIG. 8, with D chosen from central region Z1 of FIG. 5. Trace 63 of FIG. 8 illustrates the variation of DC breakdown voltage $Vt1_{DC}$ as a function of spacing dimension D of 3-stack clamp 66 of FIG. 7 wherein each transistor 40-1, 40-2, 40-3 is of type ESD-Z1 illustrated in FIG. 4 and individually having the properties illustrated by trace 61 of FIG. 8 with D chosen from central region Z1 of FIG. 5. In general, $(Vt1)_{2\text{-}STACK} \sim (Vt1)_{40\text{-}1} + (Vt1)_{40\text{-}2}$, and $(Vt1)_{3\text{-}STACK} \sim (Vt1)_{40\text{-}1} + (Vt1)_{40\text{-}2} + (Vt1)_{40\text{-}3}$, etc. Serially cascading (stacking) individual ESD-Z1 transistors 40 having the response illustrated in trace 61 of FIG. 8 enables higher trigger voltages $(Vt1)_{STACK}$ to be obtained than would otherwise be possible with single ESD-Z1 device 40. It will also be noted that slope $(\Delta Vt1_{DC}/\Delta D)$ of the Vt1 versus D traces increases about in direct proportion to the number of transistors 40 in the stack. For example, single transistor ESD-Z1 (see trace 61 of FIG. 8) has $(\Delta Vt1_{DC}/\Delta D)_{SINGLE\text{-}Z1}$ of about 25 volts per micrometers, 2-stack clamp 65 (see trace 62 of FIG. 8) has $(\Delta Vt1_{DC}/\Delta D)_{2\text{-}STACK\text{-}Z1}$ of about 50 volts per micrometer and 3-stack clamp 66 (see trace 63 of FIG. 8) has $(\Delta Vt1_{DC}/\Delta D)_{3\text{-}STACK}$ of about 75 volts per micrometer over the range of spacing dimension D illustrated in FIG. 8. Thus, by cascading individual ESD-Z1 transistors 40, a wide range of $Vt1_{DC}$ (and also $Vt1_{AC}$) values can be obtained. This is very useful.

The variation in $Vt1_{DC}$ (and $Vt1_{AC}$) across the die or wafer for such stacked arrangements can be estimated from the slope ($\Delta Vt1_{DC}/\Delta D$) of traces 61-63 of FIG. 8. Suppose for example, that the effective variation of spacing dimension D across the die or wafer or from wafer to wafer (e.g., because of differences in azimuthal orientation) corresponds to about $\Delta D$ micrometers. Accordingly, where only a single type ESD-Z1 device is used (e.g., trace 61 of FIG. 8), then using the values for the slopes of trace 61 provided above, the variation $\Delta Vt1_{DC}$ (and $\Delta Vt1_{AC}$) across the die or wafer for a single device would be about $(\Delta Vt1)_{SINGLE-Z1} \sim \Delta D*25$ volts. This can amount to about $(\Delta Vt1)_{SINGLE-Z1} \sim 3$ to 4 volts. While such variation may be tolerable (although undesirable), the situation becomes much worse when such devices are cascaded since, as noted above, the sensitivity $\Delta Vt1$ to spacing dimension variations $\Delta D$ increases approximately in direct proportion to the number of ESD-Z1 devices 40 in the ESD stack. For example, in 2-stack clamp 65, the expected variation is about $(\Delta Vt1)_{2-STACK-Z1} \sim \Delta D*50$ volts, and for 3-stack clamp 66 the variation is about $(\Delta Vt1)_{3-STACK-Z1} \sim \Delta D*75$ volts, which can amount to about $(\Delta Vt1)_{2-STACK-Z1} \sim 6$ to 8 volts and $(\Delta Vt1)_{3-STACK-Z1} \sim 9$ to 12 volts for the same $\Delta D$ variation as described above. This is highly undesirable, especially since the use of stacked ESD devices often cannot be avoided in order to obtain Vt1 values in the desired voltage range. Accordingly, it is important to provide a means and method by which the excess sensitivity of trigger voltage Vt1 in stacked ESD devices to variations in spacing dimension D can be minimized. Stated another way, it is important to be able to reduce the slope ($\Delta Vt1/\Delta D$) of the Vt1 versus spacing dimension D characteristics of multi-device stacks of ESD transistors.

Figure 9:
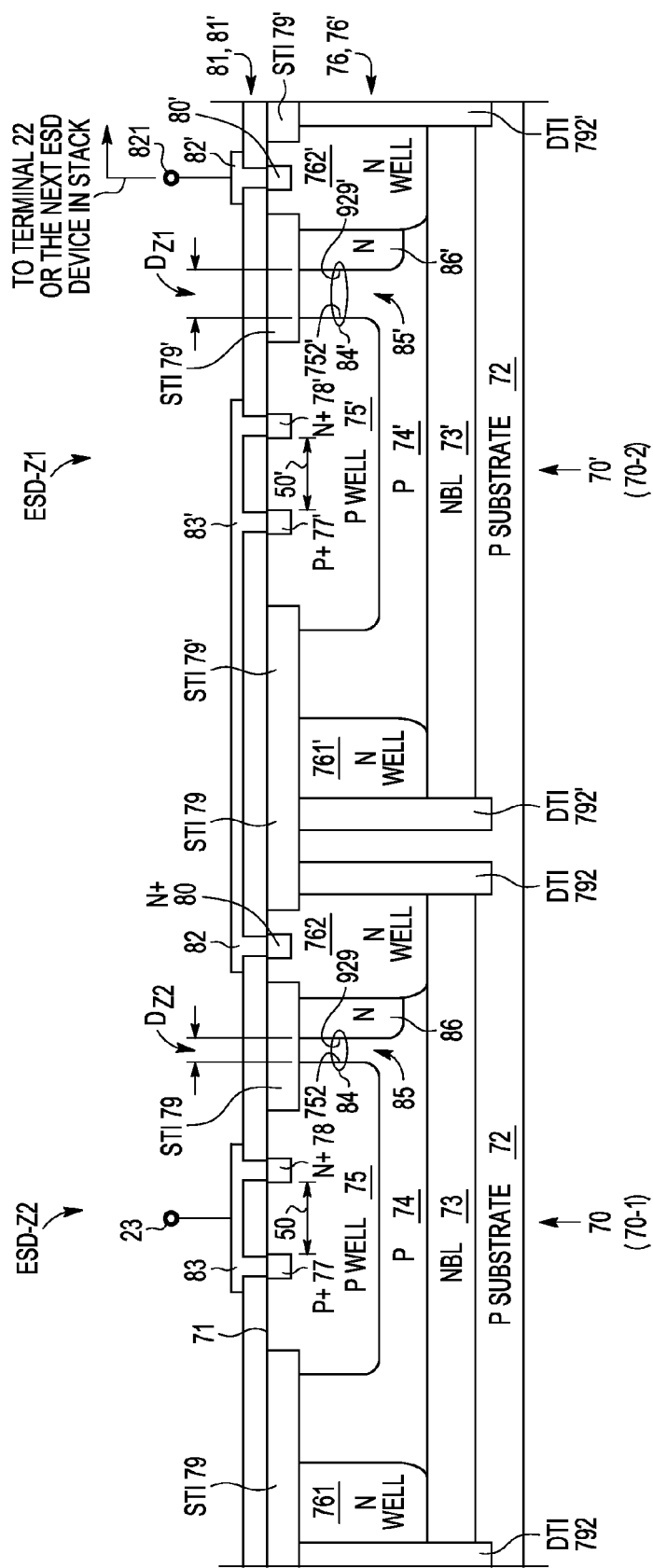
FIG. 9 shows a simplified cross-sectional view of a 2-Stack ESD clamp implemented in a semiconductor substrate according to a further embodiment of the present invention.

FIG. 9 shows a simplified cross-sectional view of illustrative 2-Stack ESD clamp 99 implemented in semiconductor substrate 72 according to a further embodiment of the invention. 2-stack ESD clamp 99 comprises two series coupled ESD transistors 70, 70' of the type illustrated in FIG. 4. The same reference numbers are used in FIG. 9 to identify the various regions of transistors 70, 70' as are used in FIG. 4, the discussion of which can be referred to for further details. A prime (') has been added to the corresponding regions of transistor 70'. (Where a third transistor is serially coupled to transistors 70, 70' of FIG. 9 to form a 3-stack clamp such as is described schematically later in FIGS. 12-15, the various regions of such third transistor 70" can be identified by the same reference numbers as in devices 70, 70' but with a double prime (") added thereto. To avoid unduly cluttering the drawings, such configurations are omitted in the device cross-sections.) Transistor 70 has lateral Lbe spacing 50 between doped regions 77, 78 and transistor 70' has lateral Lbe spacing 50' between doped regions 77', 78'. Lateral Lbe spacings 50, 50' may be the same or different for transistors 70, 70', as is discussed more fully later.

Transistors 70, 70' have different values of spacing dimensions D, with transistor 70 in this example having spacing dimension $D_{Z2}$ between boundaries 752, 929 corresponding to Zone Z2 of FIG. 5 and transistor 70' having spacing dimension $D_{Z1}$ between boundaries 752', 929' corresponding to Zone Z1 of FIG. 5. By way of example and not intended to be limiting, ESD transistor 70' is shown at the right of FIG. 9 with collector contact conductor 82' coupled to terminal 821 leading in the case of a 2-stack to I/O terminal 22, or in the case of a 3-stack or higher to the next device in the stack. Transistor 70 is shown at the left in FIG. 9 with emitter-base contact conductor 83 coupled to GND terminal 23. Collector contact conductor 82 of transistor 70 is coupled to base-emitter contact 83' of transistor 70'. NBL regions 73, 73' are electrically isolated by central and peripheral deep trench isolation (DTI) walls 792, 792' so that transistors 70, 70' can be coupled in series to form 2-stack 99 (or a portion of a 3-stack or higher). It does not matter which of transistors 70, 70' has spacing dimension $D_{Z1}$ and which has spacing dimension $D_{Z2}$, and such spacing may be interchanged (i.e., commuted). This commutability applies to all of the $D_{Z1}$, $D_{Z2}$, $D_{Z3}$, etc., sequence variations discussed in connection with FIGS. 10-15 following. In a preferred embodiment, N WELLS 76, 76' are annular in plan view shape and laterally surround interior elements 74, 75, 77, 78, etc., and 74', 75', 77', 78', etc., respectively. In other embodiments, N WELLS 76, 76' need not be annular in plan view shape, but can terminate at dielectric isolation walls lying in planes above and below the plane of FIG. 10. Either arrangement may be used.

FIGS. 10-15 show simplified schematic diagrams of serially cascaded stacks 100-105 of ESD transistors 70 (and 70', 70', etc.), wherein FIGS. 10-12 shows 2-stack clamps 100, 101, 102 and FIGS. 12-14 show 3-stack clamps 103, 104, 105 according to various still further embodiments of the present invention. The various ESD transistors incorporated in stacks 100-105 have spacing dimensions D corresponding to zones Z1, Z2 and/or Z3 in these examples. The convention is adopted of identifying the type of ESD transistor according to which range of D values is being used therein. For example, transistor type ESD-Z1 indicates that spacing dimension D of such transistor is chosen from zone Z1 of FIG. 5, transistor type ESD-Z2 indicates that spacing dimension D of such transistor is chosen from zone Z2 of FIG. 5, and transistor type ESD-Z3 indicates that spacing dimension D of such transistor is chosen from zone Z3 of FIG. 5. 2-stack clamp 100 of FIG. 10 shows first transistor 70-1 of type ESD Z2 with a first lead coupled to terminal 23 of circuit 20 of FIG. 1 and a second lead serially coupled to a first lead of second transistor 70-2 of type ESD-Z1 whose second lead is coupled to terminal 22 of circuit 20 of FIG. 1. The cross-sectional view illustrated in FIG. 9 corresponds to 2-stack clamp 100. 2-stack clamp 101 of FIG. 11 shows first transistor 70-3 of type ESD Z1 with a first lead coupled to terminal 23 of circuit 20 of FIG. 1 and a second lead serially coupled to a first lead of second transistor 70-4 of type ESD-Z3 whose second lead is coupled to terminal 22 of circuit 20 of FIG. 1. 2-stack clamp 102 of FIG. 12 shows first transistor 70-5 of type ESD Z2 (or type ESD-Z3, not shown) with a first lead coupled to terminal 23 of circuit 20 of FIG. 1 and a second lead serially coupled to a first lead of second transistor 70-6 of type ESD-Z3 (or type ESD-Z2, not shown) whose second lead is coupled to terminal 22 of circuit 20 of FIG. 1. The serial order of transistors 70-1, 70-2 and 70-3, 70-4 and 70-5, 70-6 in 2-stacks clamps 100-102 is not significant and they may be interchanged (commuted). Stated another way, according to various embodiments of the invention, serially coupled 2-stacks of transistors 40-i and 40-j desirably use any combination of type ESD-Z1, ESD-Z2, and ESD-Z3 clamp transistors except two serially coupled type ESD-Z1 transistors.

Figure 2:
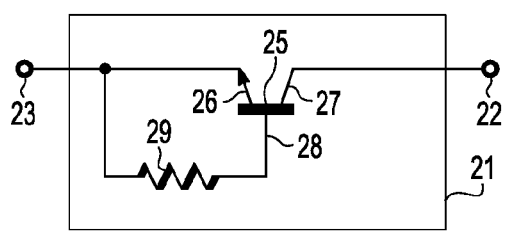
FIG. 2 is a simplified schematic diagram illustrating the internal components of the ESD clamp of FIG. 1.

3-stack clamp 103 of FIG. 13 shows first transistor 70-7 of type ESD-Z2 with a first lead coupled to terminal 23 of circuit 20 of FIG. 1 and a second lead serially coupled to a first lead of second transistor 70-8 of type ESD-Z1 whose second lead is coupled to a first lead of third transistor 70-9 of type ESD-Z2 whose second lead is coupled to terminal 22 of circuit 20 of FIG. 1. 3-stack clamp 104 of FIG. 14 shows first transistor 70-10 of type ESD-Z1 with a first lead coupled to terminal 23 of circuit 20 of FIG. 1 and a second lead serially coupled to a first lead of second transistor 70-11 of type ESD-Z3 whose second lead is coupled to a first lead of third transistor 70-12 of type ESD-Z3 whose second lead is coupled to terminal 22 of circuit 20 of FIG. 1. 3-stack clamp 105 of FIG. 15 shows first transistor 70-13 of type ESD-Z2 with a first lead coupled to terminal 23 of circuit 20 of FIG. 1 and a second lead coupled to a first lead of second transistor 70-14 of type ESD-Z1 whose second lead is serially coupled to a first lead of third transistor 70-15 of type ESD-Z3 whose second lead is coupled to terminal 22 of circuit 20 of FIG. 1. As noted above in connection with 2-stack clamps 100-102, the order of serially coupled transistors 70-7, 70-8, 70-9 and 70-10, 70-11, 70-12 and 70-13, 70-14, 70-15 in 3-stack clamps 103-105 does not matter and the corresponding spacing dimensions $D_{Z1}$, $D_{Z2}$, $D_{Z3}$ may be commuted in such transistors. According to various embodiments of the invention, serially coupled 3-stacks of transistors 40-i, 40-j and 40-k desirably use any combination of type ESD-Z1, ESD-Z2, and ESD-Z3 clamp transistors except two or more serially coupled type ESD-Z1 transistors. Stated another way, no more than one ESD transistor with spacing dimension D corresponding to zone Z1 should be serially coupled with at least one ESD transistor with spacing dimension D corresponding to zones Z2 and/or Z3. Stated still another way, the ESD transistor stack(s) of various embodiments of the present invention can comprise zero or one ESD transistor(s) with spacing dimension $D_{Z1}$ from zone Z1 serially coupled to one or more ESD transistors with spacing dimension $D_{Z2}$ and/or $D_{Z3}$ from zone Z2 and/or zone Z3 or both zones Z2 and/or Z3. The order of such ESD transistors in the stack is not important. While only 2-stack and 3-stack ESD clamps are illustrated in FIGS. 10-15, persons of skill in the art will understand that any number of ESD devices 70-1 ... 70-N can be stacked to obtain the desired trigger voltage $Vt1_{STACK}$.

FIG. 16 shows simplified plot 87 of DC breakdown voltage $Vt1_{DC}$ in volts as a function of lateral base-collector spacing dimension D in micrometers for different 2-stack clamps of cascaded ESD transistors, comparing the results for a 2-stack clamp of transistors 40 to the results with 2-stack clamps of transistors 70 according to embodiments of the present invention. Trace 87-1 ("2-stack Z1+Z1") shows the variation in $Vt1_{DC}$ with base-collector spacing dimension D for a 2-stack clamp having type ESD-Z1 transistors 40 with spacing dimension D chosen from zone Z1. Trace 87-1 of FIG. 16 and trace 62 of FIG. 8 show substantially the same data. Trace 87-2 and trace 87-3 show the variation in $Vt1_{DC}$ with base-collector spacing dimension D for 2-stack clamps of transistors 70 according to various embodiments of the present invention. Trace 87-2, identified as "2-stack Z1+Z2", corresponds to a 2-stack having first ESD transistor ("ESD-Z1") with spacing dimension $D_{Z1}$ chosen from zone Z1 of FIG. 5 serially coupled to second transistor ("ESD-Z2") having spacing dimension $D_{Z2}$ chosen from zone Z2 of FIG. 5. Trace 87-3, identified as "2-stack Z1+Z3", corresponds to a 2-stack having first ESD transistor ("ESD-Z1") with spacing dimension $D_{Z1}$ chosen from zone Z1 of FIG. 5 serially coupled to second transistor ("ESD-Z3") having spacing dimension $D_{Z3}$ chosen from zone Z3 of FIG. 5. Trace 87-2 corresponds to 2-stack clamp 99 of FIGS. 9 and 2-stack clamp 100 of FIG. 10, and trace 87-3 corresponds to 2-stack clamp 101 of FIG. 11 according to embodiments of the present invention. Traces 87-2, 87-3 have slopes ($\Delta Vt1/\Delta D$) that are similar and about half that of trace 87-1 of 2-stack clamp 65 of FIG. 6. Since the variation $\Delta Vt1$ across the die or wafer is approximately directly proportional to slope ($\Delta Vt1/\Delta D$) of the Vt1 versus D plots, 2-stacks clamps 100, 101 of the present invention have about half the sensitivity to spacing variation $\Delta D$ as 2-stack 65. The variation $\Delta Vt1$ across the die or wafer of further 2-stack clamp 102 and 3-stack clamps 103-105 of further embodiments of the present invention is similarly proportional to the differences in slope ($\Delta Vt1/\Delta D$), and in the case of 3-stack clamps 103-105 have about one-third the $\Delta Vt1$ sensitivity to unavoidable spacing variations $\Delta D$ of 3-stack clamp 66. Thus, by choosing base-collector spacing dimensions D of the various transistors 70 used to form multi-transistor ESD stacks according to the rules explained above, the sensitivity of stacked ESD clamps to spacing variations $\Delta D$ can be significantly reduced compared to multi-transistor ESD stacks that utilize only base-collector spacing dimensions D from central zone Z1 of FIG. 5. Further, the arrangements for obtaining such reduced sensitivity to unavoidable spacing variations $\Delta D$ do not limit the range of Vt1 values than can be obtained nor significantly increase the occupied device area or add further manufacturing process steps. This is a significant advance in the art and very useful for providing a wide range of ESD trigger voltages Vt1 for ICs and other devices and circuits at no significant increase in cost.

Figure 17:
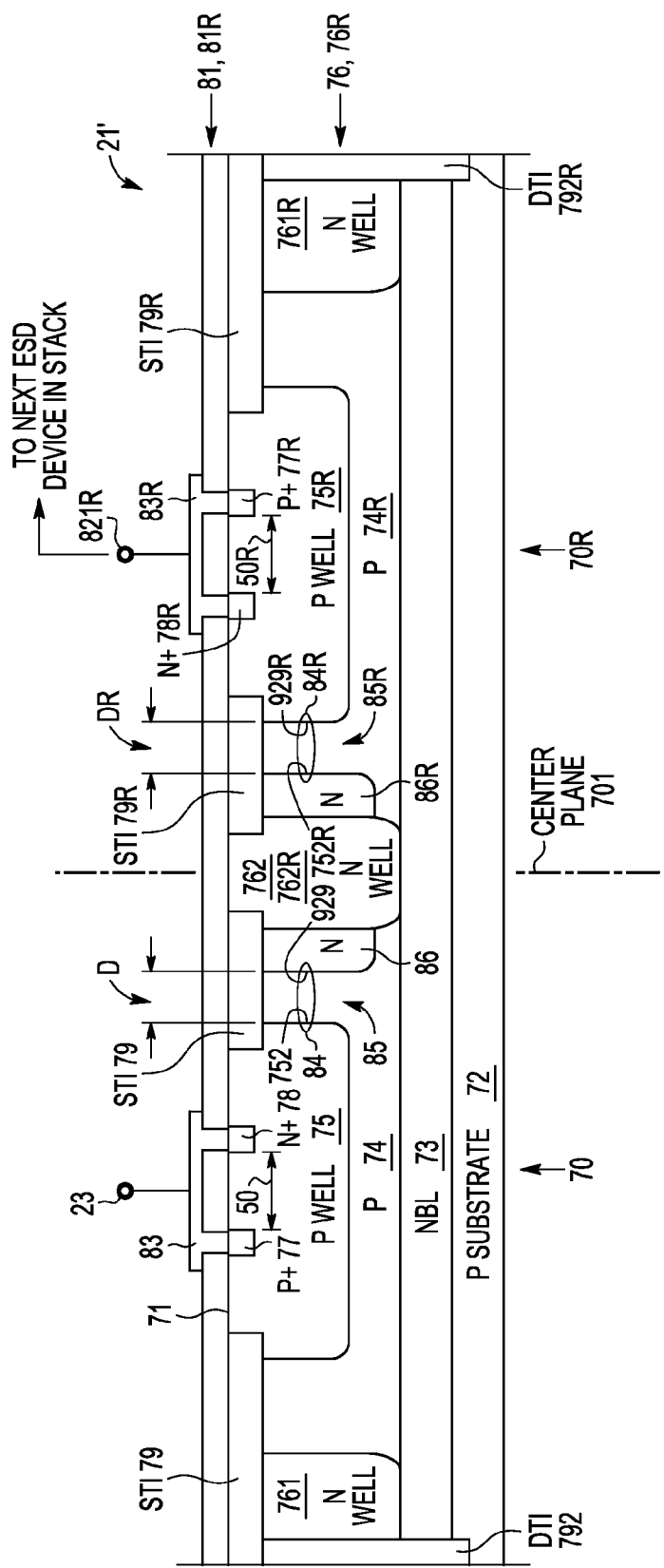
FIG. 17 shows a simplified cross-sectional view of an ESD clamp implemented in a semiconductor substrate and analogous to that of FIG. 4, but according to a yet further embodiment of the present invention wherein a bidirectional ESD function is provided.

FIG. 17 shows a simplified cross-sectional view of ESD clamp 700 implemented in semiconductor substrate 72 (e.g., P), analogous to ESD clamp transistor 70 of FIG. 4, but according to a yet further embodiment of the present invention wherein a bidirectional ESD function is provided. ESD clamp 700 comprises ESD transistor 70 (e.g., at the left in FIG. 17) of the type described in connection with FIG. 4, combined with ESD transistor 70R (e.g., at the right in FIG. 17) of the same type as ESD transistor 70 of FIG. 4 but laterally mirrored or reflected in center plane 701. The discussion of the various regions of ESD transistor 70 of FIG. 4 applies to FIG. 17 and the same reference numbers are used in connection with ESD transistor 70 at the left of FIG. 17. Analogous reference numbers are also used in connection with transistor 70R at the right of FIG. 17 modified by the addition of "R" to indicate that they are laterally reflected or mirrored in plane 701 compared to the equivalent regions in transistor 70. Thus, ESD transistor 70 of FIG. 17 (like ESD transistor 70 of FIG. 4) has P WELL region 75, N WELL regions 761, 762 (collectively 76), P+ region 77, N+ region 78, avalanche zone 84 in portion 85 of P region 74, further N region 86, STI regions 79, DTI regions 792, dielectric layer 81, conductive base-emitter contact conductor 83, base-collector spacing dimension D between boundaries 752, 929, and Lbe spacing 50 between (e.g., P+) doped region 77 and (e.g., N+) doped region 78. Contact conductor 83 is conveniently coupled to GND or common terminal 23 (see FIG. 1). ESD transistor 70R has equivalent regions 75R, 761R, 762R, 76R, 77R, 78R, 84R, 85R, 79R, 792R, 81R, 83R, base-collector spacing dimension DR between boundaries 752R and 929R, and Lbe spacing 50R between (e.g., P+) region 77R and (e.g., N+) region 78R, in mirror configuration to the corresponding regions in transistor 70, Lbe spacings 50, 50R may be the same or different for transistors 70, 70R. Substrate 72 and NBL 73 are common. N WELL collector region 762 of transistor 70 and N WELL collector region 762R of transistor 70R are merged around center plane 701. Base-emitter contact conductor 83R is coupled to terminal 821R which is coupled to the next ESD device in the ESD stack. Because collector regions 672 and 672R are merged, conductor 82 of device 70 of FIG. 4 is not needed in the arrangement of device 700 of FIG. 17. For the same reason, N+ collector contact region 80 (and 80R) of device 70 of FIG. 4 is also conveniently omitted, but may be included in other embodiments.

Bi-directional ESD devices 700 are incorporated in ESD stack clamps 100-105 of FIGS. 10-15 in substantially the same manner as ESD clamps 70, wherein a first device 700-1 will have D and DR chosen, for example, from zone Z1 and a second, serially coupled device 700-2 will have D and DR chosen from Z2 or Z3 or a combination thereof depending upon the number of devices 700 being included in the stack. In further embodiments, device 700-1 and/or 700-2, etc., may be chosen from zones Z2 and/or Z3 and no transistor from zone Z1 included in the stack. All such variations are useful. The discussion associated with FIGS. 4-16 should be referred to for further details and variations according to still further embodiments of the invention wherein, for example, devices of type 700 may be substituted for any of devices 70-1 through 70-15, etc., in clamps 100-105. If base-collector spacing dimensions D and DR are substantially the same within device 700, then Vt1 will be substantially the same for both polarities of voltage applied across terminals 22, 23 of stacks 100-105 of FIGS. 10-15 comprising serially coupled devices 700-1, 700-2, etc., of FIG. 17. However, in other embodiments, wherein it is desired that Vt1 be different for different polarities, then different values may be chosen for spacing dimensions D and DR within one or more of devices 700-1, 700-2, etc.

FIGS. 18-22 and 23-28 are simplified cross-sectional views of ESD clamp 99 of FIG. 9 during various stages 118-122 and 123-128 of manufacture illustrating resulting structures 218-222 and 223-228, according to still yet further embodiments of the present invention and showing additional detail. Manufacturing stages 122-1 and 122-2 of FIGS. 22-1 and 22-2 are discussed later. As noted in connection with FIG. 9, ESD clamp 99 is formed by laterally combining and serially coupling transistors 70, 70' illustrated individually in FIG. 4 but having different base-collector spacing dimensions D. In FIG. 9, the same reference numbers as in FIG. 4 are used to identify the various regions of leftward device 70, and the same reference numbers with a prime (') added are used to identify analogous regions of rightward device 70'. This same convention is followed in FIGS. 18-28. Doping levels and/or doping doses are included in the discussion of FIGS. 18-28 by way of describing a preferred embodiment and not for limitation. Ion implantation is a preferred method of doing various regions within device 99 but is not intended to be limiting and other doping methods well known in the art may also be used. Photo resist is a suitable masking material for use with ion implant doping and is presumed in what follows unless otherwise specifically noted, but is not intended to be limiting. Persons of skill in the art will understand that other types of masking layers or materials well known in the art may also be used depending on the dopant and doping method desired to be used. Similarly, the manufacturing process is illustrated for silicon semiconductor, by way of example and not limitation. Those of skill in the art will understand that substantial modification of the choice of semiconductor material, dopants, doping methods, doping levels and/or doses and dimensions of various regions within device 99 may be made depending upon the particular device characteristics desired and that those presented herein are not intended to be limiting. Further, it will be understood that while FIGS. 18-22 and 23-28 illustrate the various stages used to form device 99 of FIG. 9, that substantially the same stages are used to form devices 40, 70 of FIG. 4 and device 700 of FIG. 17 with appropriate mask changes that will be understood by those of skill in the art.

Referring now to manufacturing stage 118 of FIG. 18, initial semiconductor substrate 72i (e.g., P type) is provided wherein lower portion 721 is preferably boron doped at about $5E18$ $cm^{-3}$ and upper portion (e.g., EPI-1) 722 with upper surface 724 is preferably boron doped at about $2E15$ $cm^{-3}$. Upper portion 722 is preferably formed by epitaxial deposition referred to, for example, as "EPI-1". Thickness 723 of EPI-1 layer 722 is conveniently in the range of about 7 to 8 micrometers, but larger or smaller thicknesses may also be used. Structure 218 results.

Referring now to manufacturing stage 119 of FIG. 19, mask 90 having closed portions 901 and open portions 902, 903 is applied over surface 724 of structure 218. Implant A is provided through open portions 902, 903 to form, respectively NBL regions 73 and 73' in substrate 72i. For silicon SC, antimony is a suitable dopant for providing NBL layers 73, 73'. A peak doping density of about $1E19$ $cm^{-3}$ and depth 731 in the range of about 1 to 2 micrometers below surface 724 is preferred but other dopants, concentrations and depths may also be used. Structure 219 results. Referring now to manufacturing stage 120 of FIG. 20, mask 90 is removed and second epitaxial layer 740 (e.g., "EPI-2") of thickness 741 of about 3 to 4 micrometers is formed on surface 724 over substrate 72i with NBL regions 73, 73'. EPI-2 layer 740 is conveniently boron doped to a doping density of about $2E15$ $cm^{-3}$, but larger or smaller doping levels and thicknesses may also be used. EPI-2 layer 740 has upper surface 71 and provides P regions 74. 74' of device 99. Structure 220 results, hereafter referred to as substrate 72.

Referring now to manufacturing stage 121 of FIG. 21, conventional shallow trench isolation (STI) regions 79, 79' are formed at the desired locations in surface 71 of structure 220 (substrate 72) and deep trench isolation (DTI) regions 792 are formed in substrate 72 extending, for example, to initial substrate region 721, using means well known in the art. DTI regions 792 are typically formed of grown or deposited silicon oxide or a combination thereof and may in various embodiments have a poly-silicon core (not shown) according to the available manufacturing processes. Either arrangement is useful. Peripheral DTI regions 792, 792' at the left and right, respectively, of FIG. 21 and following, electrically isolate devices 70, 70' from other devices on the die. Centrally located DTI regions 792, 792' electrically isolate transistors 70, 70' from each other so that they may be placed electrically in series (stacked). Structure 221 results. Referring now to manufacturing stage 122 of FIG. 22, mask 91 having closed portions 911 and openings 912, 913 is applied over surface 71 of EPI-2 layer 740 of substrate 72. P-type Implant B of, for example, boron is provided through openings 912, 913 of mask 91 to form P WELLs 75, 75' having lateral boundaries 752, 752', respectively, at the indicated locations, P WELL 75 being associated with leftward device 70 and P WELL 75' being associated with rightward device 70'. P WELLs 75, 75' preferably have depth 751 from surface 71 of about 30-60 percent of EPI-2 thickness 741 and peak dopant concentration in the range of about $1E17$ $cm^{-3}$ to $1E18$ $cm^{-3}$ with about $4E17$ $cm^{-3}$ to $8E17$ $cm^{-3}$ being preferred at about 0.5 to 1.0 micrometers below surface 71, but larger and smaller depths and dopant densities and other dopants may also be used. Structure 222 results.

Referring now to manufacturing stage 123 of FIG. 23, mask 91 is removed and replaced with mask 92 having closed portions 921 and openings 922, 923, 924 and 925. N-type Implant C is provided through openings 922, 923, 924 and 925 to form N WELL regions 926, 927 associated with transistor 70 and N WELL regions 926', 927' associated with transistor 70', wherein lateral boundary 929 is associated with region 927 and boundary 929' is associated with region 927', with spacing dimension $D_{Z2}$ between boundaries 752, 929 and spacing dimension $D_{Z1}$ between boundaries 752', 929'. Phosphorus is a suitable dopant for such N WELL regions. A peak concentration in the range of about $1E17$ $cm^{-3}$ to $1E18$ $cm^{-3}$ is useful with about $4E17$ $cm^{-3}$ to $8E17$ $cm^{-3}$ being preferred, located about 1 to 1.5 micrometers beneath surface

71 and total depth 928 about 30-60 percent larger than depth 751 of P WELLs 75, 75' but less than thickness 741 of EPI-2 layer 740, but other dopants and doping densities and depths may also be used. Structure 223 results. The relative lateral location of opening 912 in mask 91 for forming P WELL region 75 in manufacturing stage 122 versus the location of opening 923 of mask 92 for forming N WELL region 927 in manufacturing stage 123 determines spacing dimension $D_{Z2}$ of device 70 of ESD clamp 99. The relative lateral location of opening 913 in mask 91 for forming P WELL region 75' in manufacturing stage 122 versus the location of opening 925 of mask 92 for forming N WELL region 927' in manufacturing stage 123 determines spacing dimension $D_{Z1}$ of device 70' of ESD clamp 99. Persons of skill in the art will understand based on the description herein that other combinations of spacings $D_{Z1}$, $D_{Z2}$, and $D_{Z3}$ may be obtained by adjusting the relative lateral locations of such P WELL and N WELL openings in masks 91, 92.

Referring now to manufacturing stage 124 of FIG. 24, mask 92 is removed and replaced with mask 93 having closed portions 931 and openings 932, 933, 934 and 935. N-type Implant D is provided through openings 932, 933, 934 and 935 to form N WELL regions 936, 937 associated with transistor 70 and N WELL regions 936', 937' associated with transistor 70'. In a preferred embodiment, openings 932, 934 of mask 93 are substantially coincident with openings 922, 924 of mask 92, but in other embodiments may differ. Again, in a preferred embodiment, openings 933 and 935 of mask 93 are narrower and lie within openings 923 and 925 of mask 92, but may have other extents in further embodiments. The purpose of mask 93 with openings 932, 933, 934 and 935 and Implant D is to extend N WELL regions 926, 927, 926', 927' formed in manufacturing stage 123 to form N WELL regions 936, 937, 936', 937' that make Ohmic contact with NBLs 73, 73'. Phosphorus is a suitable dopant for Implant D to form such N WELL regions. A first peak concentration in the range of about $5E17$ $cm^{-3}$ to $2E18$ $cm^{-3}$ at a first depth below surface 71 in the range of about 0.5 to 1 micrometers and a second peak concentration in the range of about $4E17$ $cm^{-3}$ to $1E18$ $cm^{-3}$ at a second depth below surface 71 in the range of about 1.5 to 2 micrometers and a total depth sufficient to Ohmically couple N WELL regions 936, 937, 936', 937' to NBL 73, 73' is preferred, but other dopants and doping densities and depths may also be used. Structure 224 results. N WELLS 936, 937, 936' and 937' correspond to N WELLS 761, 762, 761' and 762' of device 99 of FIG. 9 and are identified as such hereafter. The portions of N WELLs 927, 927' that extend laterally beyond N WELLs 937, 937' correspond to further N regions 86, 86' of FIG. 9, and are identified as such hereafter. Manufacturing stages 123, 124 may be performed in either order and may be performed before or after manufacturing stage 122.

Referring now to manufacturing stage 125 of FIG. 25, mask layer 93 is removed and "silicide block" layer 94 applied over surface 71 and patterned to provide silicide block regions 941 wherever it is desired to prevent reaction between a silicide forming conductor (to be deposited later) and exposed portions of semiconductor surface 71, and openings 942 between silicide block regions 941 where it is desired for the subsequently deposited conductor to form silicides ensuring good Ohmic contact to the underlying portions of SC surface 71. In a preferred embodiment, silicide block layer 94 is also conveniently used to define Lbe spacing 50, 50', 50R of FIGS. 4, 9, 17, 29 and 30. For example, openings 9421, 9422 of silicide block layer 94 are separated by lateral distance 501 and openings 9424, 9425 are separated by lateral distance 501', substantially corresponding in lateral size to desired Lbe spacings 50, 50' or 50, 50R of FIGS. 4, 9, 17, 29 and 30. In a preferred embodiment, silicide block layer 94 preferably comprises a first layer of silicon oxide of about 10-20 nanometers thickness overlying surface 71 followed by a second layer of silicon nitride of about 40-80 nanometers thickness overlying the first layer, but other materials and thicknesses may also be used in other embodiments and the terms "silicide block layer" and "silicide block, regions" are intended to include such variations. Structure 225 results. While provision of silicide block regions 941 is desirable, they may be omitted in yet further embodiments and lateral separations 50, 50', 50R, etc., may be determined by the lateral spacing of openings in masks 95 and 96. In subsequent FIGS. 26-28, silicide block regions 941 are indicated by dashed lines, but are ignored in FIGS. 4, 9, 17, 29 and 30 since they become incorporated in surface dielectric layer 81, 81' applied in manufacturing stage 128.

Referring now to manufacturing stage 126 of FIG. 26, mask 95 is applied over surface 71 and silicide block regions 941, mask 95 having closed portions 951 and openings 952, 953, 954, 955 corresponding to the desired locations of (e.g., N+) doped Ohmic collector contacts and emitter regions to be formed using implant E. Implant E (e.g., N type) is provided through openings 952, 953, 954, 955 wherein (e.g., N+) emitter region 78 is formed through opening 952, (e.g., N+) Ohmic collector contact region 80 is formed through opening 953, (e.g., N+) doped emitter region 78' is formed through opening 954, and (e.g., N+) doped Ohmic collector contact region 80' is formed through opening 955. In order to minimize alignment issues, it is preferred that openings 952, 953, 954, 955 of mask 95 are chosen to be slightly wider than underlying openings 9421-9424 (see FIG. 25) in silicide block layer 94. In other embodiments where silicide block layer 94 is omitted, openings 952, 953, 954, 955 may correspond to the desired final width and location of the doped regions being formed by Implant E. The dopant, energy and dose of Implant E are desirably selected so as to provide relatively shallow highly doped (e.g., N+) regions 78, 78', 80, 80', as for example, employing arsenic dopant, with a peak concentration of about $1E20$ $cm^{-3}$ or greater and depth of about 0.2-0.3 micrometers, but other dopants and depths may also be used. Structure 226 results. In a preferred embodiment in which block layer 94 is used, the implant energy and block layer thickness are chosen so that block layer 94 can act as a mask to Implant E. In this way, lateral mask separations 501, 501' of manufacturing stage 125 of FIG. 25 substantially determine Lbe spacing 50, 50', etc., as will become apparent from manufacturing stage 127.

Figure 27:
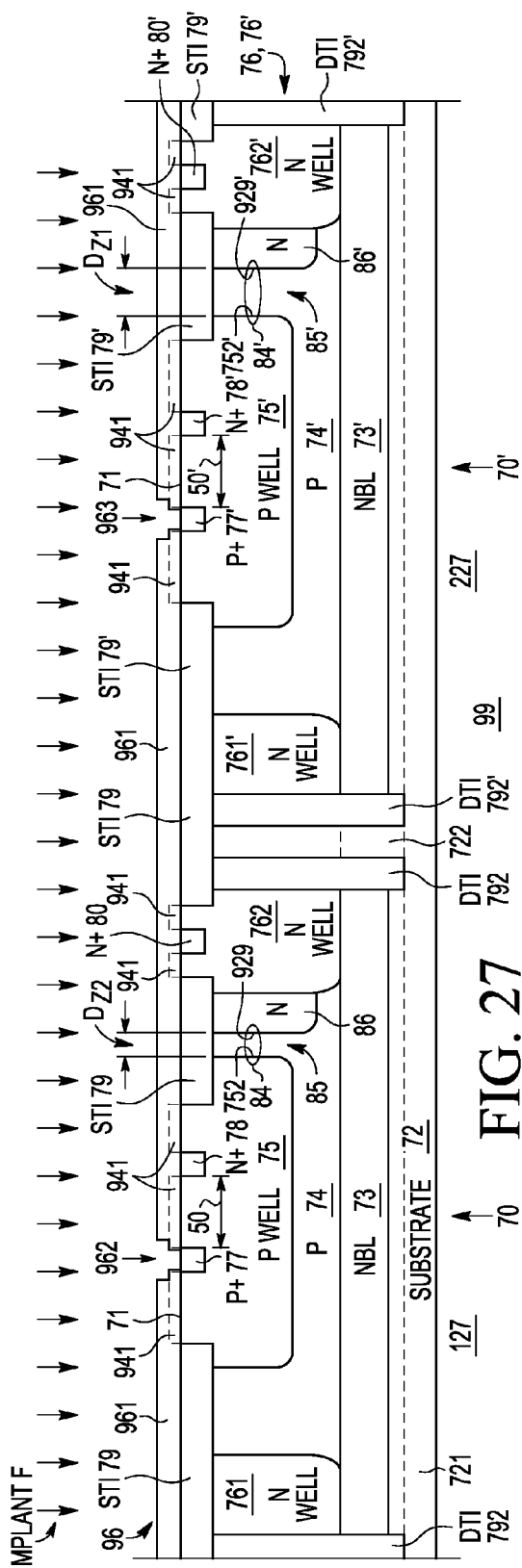

Referring now to manufacturing stage 127 of FIG. 27, mask 95 is removed and mask 96 applied with closed portions 961 and openings 962, 963 corresponding to the desired locations of (e.g., P+) doped Ohmic base contact regions 77, 77' to be formed using implant F. Implant F (e.g., P type) is provided through openings 962, 963 wherein (e.g., P+) doped Ohmic base contact region 77 is formed through opening 962 and (e.g., P+) doped Ohmic base contact region 77' is formed through opening 963. In order to minimize alignment issues, it is preferred that openings 962, 963 of mask 96 are chosen to be slightly wider than underlying openings 9421-9424 (see FIG. 25) in silicide block layer 94. In other embodiments where silicide block layer 94 is omitted, openings 962, 963 may correspond to the desired final width and location of the doped regions being formed by Implant F. The dopant, energy and dose of Implant F are selected so as to provide relatively shallow highly doped (e.g., P+) base contact regions, as for example, employing boron dopant with a peak concentration of about $1E20$ $cm^{-3}$ or greater and depth of about 0.2-0.3 micrometers, but other dopants and depths may also be used. Structure 227 results. In a preferred embodiment in which block layer 94 is used, the implant energy and block layer thickness are chosen so that block layer 94 acts as a mask to Implant F. In this way, lateral mask separation 501, 501' of manufacturing stage 125 of FIG. 25 substantially determines Lbe spacing 50, 50', etc., as previously indicated.

Figure 28:
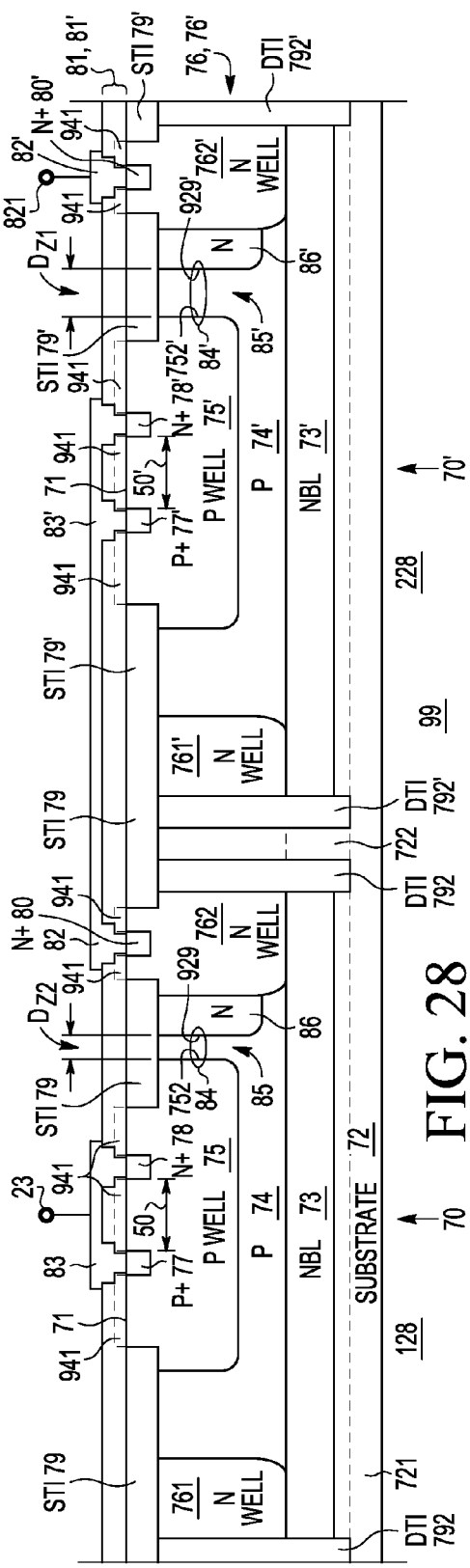

Referring now to manufacturing stage 128 of FIG. 28, mask 96 is removed, dielectric layer 81, 81' is applied and patterned to expose those portions of doped contact or emitter regions 77, 78, 80, 77', 78', 80' where Ohmic electrical contact is desired to be made and conductors 82, 82', 83, 83' applied therein and coupled to terminals 23, 821, all using means and methods well known in the art. In a preferred embodiment in which blocking layer 94 is used, the contact openings provided in dielectric layer 81, 81' may be made slightly wider than the openings in blocking layer 94 in order to minimize alignment issues, since blocking layer 94 is still present on surface 71 and insures that Ohmic contact is made by conductor 82, 82' to doped SC regions 77, 77', 78, 78' formed using the same blocking layer as part of the implant masks for Implants E and F. This is indicated in FIG. 28 but ignored in FIGS. 4, 9, 17, 29 and 30 to avoid unduly cluttering such drawings. Structure 228 results. ESD clamp 99 is substantially complete. While manufacturing stages 118-128 have illustrated how 2-stack 100 of FIGS. 9 and 10 may be formed, persons of skill in the art will understand based on the description herein how other stacks 101-105 and even single ESD devices may be fabricated in an analogous manner using substantially the same manufacturing stages as those described herein with appropriate mask changes within the competence of those of skill in the art. For example, by adjusting the relative lateral spacings and numbers of openings 912, 913, etc., of manufacturing stage 122 for producing (e.g., P type) WELLS 75, 75', etc., versus the location and numbers of openings 923, 925, etc., of manufacturing stage 123 for producing (e.g., N type) WELLS 927, 927' (and resulting (e.g., N type) regions 86, 86'), the numbers of serially stacked transistors 70-$i$+70-$j$+70-$k$, etc. (where, i, j, k . . . equal 1, 2, 3, . . . ), and their associated spacing dimensions $D_{Z1}$, $D_{Z2}$, $D_{Z3}$, etc., may be varied to yield any desired stack combination to provide the desired trigger voltage $Vt1_{STACK}$ as discussed in connection with FIGS. 10-15. It will also be appreciated based on the description herein that stacks of dual-polarity devices 700 of FIG. 17 may be provided using the illustrated manufacturing stages with appropriate alterations of the various mask openings to yield the device regions and interconnections identified in connection with FIG. 17. It should be further understood that while the manufacturing stage sequence illustrated in FIGS. 18-28 is preferred, this is intended for convenience of explanation of a preferred embodiment and not intended to be limiting, and in additional embodiments the sequence of various manufacturing stages may be interchanged. For example and not intended to be limiting, while formation of BL 73, 73' is shown as occurring after formation of EPI-1 layer 722 and prior to formation of EPI-2 layer 740, in other embodiments, it may be formed after formation of EPI-2 layer 740 or at other stages of the manufacturing process. Additionally, while portions of substrate 72 including region 74, 74' are preferably formed epitaxially, in still additional embodiments, such regions may be part of an initial substrate in which devices 70, 70', 99, 700, etc., are subsequently formed and one or both epitaxial deposition steps (e.g., EPI-1 and/or EPI-2) may be omitted. Still further, while in the preferred embodiment, (e.g., N type) WELLs 761, 762, 761', 762' are formed by multiple masking and implant steps, in other embodiments, such multiple masking and implant steps may be combined provided that the serially coupled ESD transistors in the ESD stack have different base-collector spacing dimensions D, with none or no more than one spacing dimension D chosen from zone Z1 and others chosen from zones Z2 and/or Z3 of FIG. 5, with the number depending upon the total number of stacked transistors being employed to achieve the desired value of $Vt1_{STACK}$. In further embodiments, DTI regions 792, 792' may be omitted and lateral isolation of ESD clamp transistors 70, 70', etc., be provided by means of (e.g., N type) WELLS 761, 762, etc., or equivalents. Either arrangement is useful.

Figure 3:
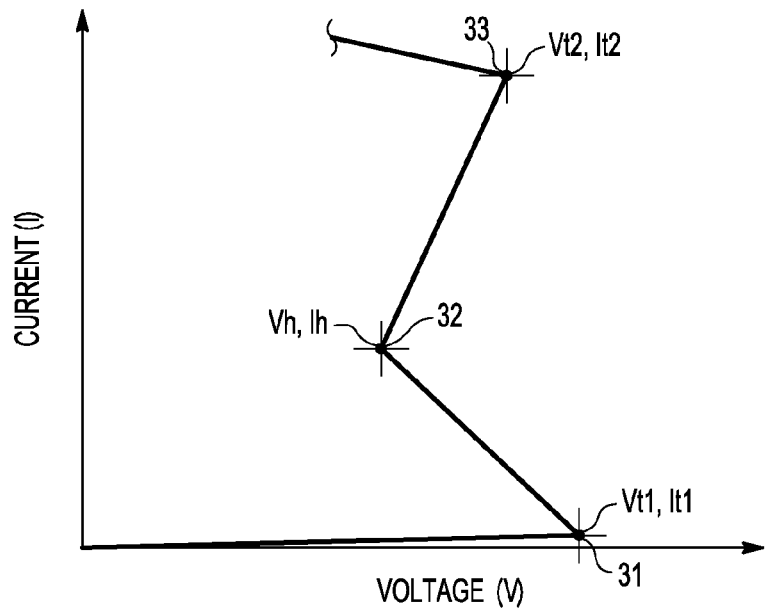
FIG. 3 is a simplified plot of current versus voltage for an electrostatic discharge (ESD) protection device, such as the device of FIG. 2.
Figure 29:
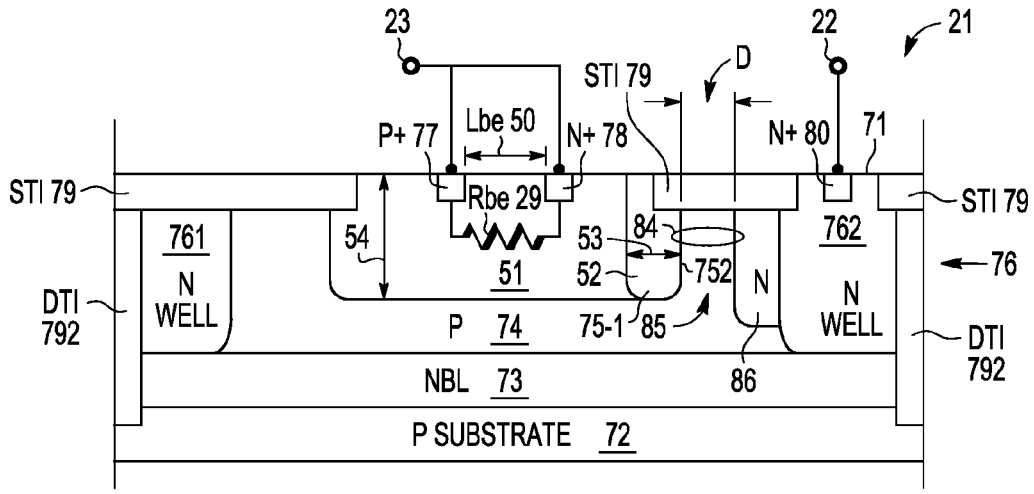
FIG. 29-30 are simplified cross-sectional view of ESD clamps, analogous to those of FIG. 4 and suitable for use in the circuits of FIGS. 1-2, but according to yet still other embodiments of the present invention.

The foregoing has explained how various embodiments illustrated above make it possible to provide ESD devices of a wide range of trigger voltages Vt1 without increasing their sensitivity to (e.g., angular and lot to lot) manufacturing variations, as have been experienced with prior art ESD devices. However, other ESD properties are also of interest. For example, it is important that the device damage-onset current threshold (e.g., It2 of FIG. 3) of the ESD device be larger than the anticipated worst case ESD current. Thus, it is important to be able to increase It2 for a given ESD device. FIG. 29 is a simplified cross-sectional view of ESD clamps 56, analogous to ESD clamps 40, 70, 99, 700 previously described and suitable for use in the circuits of FIGS. 1-2, but according to another embodiment of the present invention. FIG. 29 is somewhat simplified compared to FIGS. 4, 9 and 17. For example, layer 81 and conductors 82, 83 are omitted in order to avoid unduly cluttering the drawing. Where appropriate, the same reference numbers are used in FIG. 29 to identify analogous regions and reference should be made to the discussion of FIGS. 4, 9, 17 and 18-28 for various values of depth, thickness, dopant density, etc. For example, base portion 52 of FIG. 29 is also identified as region 75-1 to indicate, by way of example and not intended to be limiting, that it can be made (other than geometry) in the same manner as region 75 of FIGS. 4 and 22.

It has been found that parasitic base-emitter resistance Rbe 29 (see also FIG. 2) can significantly impact damage-onset current threshold It2 of ESD devices. By increasing Rbe, It2 can be increased. Rbe can be increased in several ways, for example: (i) by increasing Lbe 50, (ii) by decreasing the doping density or increasing the sheet resistance of the portion of the base proximate emitter 78 and base contact region 77 (for example and not intended to be limiting in region 51 of FIGS. 29 and 30), or (iii) increasing both Lbe and the sheet resistance of that portion of the base. The increase in Rbe achieved in these ways, can increase both the DC and AC (transient) values of It2, without significant adverse effect on other ESD device properties. This is very desirable.

Tables I and II below illustrate the comparative behavior of single stack ESD devices of the type illustrated in FIG. 29. In both Tables I and II, devices with modified Rbe are obtained by either increasing Lbe (second data line) or increasing the base sheet resistance (third data line), or both (fourth data line). The results of making such changes are compared to otherwise substantially identical but unmodified (i.e., "baseline") ESD devices whose properties are shown in the first data line of each table.

TABLE I

COMPARATIVE TRANSIENT RESPONSE OF 1-STACK ESD DEVICES

| Lbe (micrometers) | Base Sheet Resistance (ohms/sq) | Vt1 (volts) | Vsb (volts) | It2 (amps) | % It2 INCREASE | % AREA INCREASE |
|---|---|---|---|---|---|---|
| 1.75 | 800 | 23.6 | 14.6 | 6.63 | Baseline | Baseline |
| 4.0 | 800 | 23.6 | 13.7 | 7.00 | 5.6 | 4.9 |
| 1.75 | 2800 | 23.6 | 13.3 | 7.20 | 8.6 | 0 |
| 6.0 | 2800 | 23.6 | 11.9 | 7.70 | 11.6 | 9.3 |

TABLE II

COMPARATIVE DC RESPONSE OF 1-STACK ESD DEVICES

| Lbe (micro-meters) | Base Sheet Resistance (ohms/sq) | Vt1 (volts) | Vsb (volts) | It2 (amps) (see note) | % It2 IN-CREASE | % AREA IN-CREASE |
|---|---|---|---|---|---|---|
| 1.75 | 800 | 22 | 8.1 | 0.65 | Baseline | Baseline |
| 4.0 | 800 | 22 | 6.3 | >0.77 | >18.2 | 4.9 |
| 1.75 | 2800 | 22 | 6.1 | >0.77 | >18.2 | 0 |
| 6.0 | 2800 | 22 | 5.8 | >0.77 | >18.2 | 9.3 |

(NOTE:
The maximum observable DC current here was limited by the tester to 0.77 amps)

It is apparent that increasing Rbe, for example: (i) by increasing Lbe, or (ii) by increasing the resistivity (e.g., sheet resistance) of the base region proximate the emitter and base contact (e.g., in region 51 of FIG. 29) or (iii) by increasing both, provides improved (i.e., larger) It2. Thus, the ability of the ESD device to absorb an ESD current is improved and the ESD device is more robust. Where this is accomplished by increasing Lbe, this produces an increase in device area compared to a baseline (unmodified) device of the same base resistivity. However, in both the AC and DC tests of devices with increased Lbe, the percent improvement in It2 is several times the percent area increase. This is favorable. When Lbe is kept unchanged, and the base resistivity (e.g., sheet resistance) increased, no increase in area results even though a significant improvement in It2 is obtained. This is very desirable.

In those cases in TABLES I and II where Lbe was changed compared to the baseline device, both portions 51 and 52 of the base in FIG. 29 had the same doping and the same configuration as described in connection with WELL region 75 of FIGS. 4 and 22. The doping on either side of gap D was unchanged as between the baseline devices and the devices with modified Lbe. The Vt1 values for the modified devices were the same as the baseline device, indicating that increasing Lbe in this way did not substantially alter the breakdown mechanism. In those cases in TABLES I and II where the base sheet resistance was changed, this change was made in region 51 (see FIG. 29) proximate base contact region 77 and emitter 78, but not in region 52 proximate boundary 752 of avalanche region 84 in base portion 85. The doping in region 52 corresponds to that described for WELL 75 (see the discussion of FIGS. 4 and 22). Leaving portion 52 (e.g., portion 75-1) of the base adjacent boundary 752 unchanged from the baseline device minimizes any adverse effect on Vt1 of changing the base resistivity in region 51 and the observed Vt1 values are substantially the same as for the baseline device. Region 52 has lateral width 53 so as to separate boundary 752 from higher resistivity portion 51 in preferred embodiments.

For a given base doping, the minimum Rbe is determined primarily by the minimum achievable value of Lbe, usually set by the minimum achievable feature spacing of the particular fabrication process being used. It has been found that Rbe values of at least about 1 Ohms and up to about 800 Ohms are useful. Rbe values in the range of about 2 to 240 Ohms are more convenient for increasing It2, which values of Rbe correspond to Lbe spacings of about 2.5 to about 32 times a minimum Lbe spacing of, for example, about 0.7 micrometers. It2 improves as Lbe (and Rbe) is increased for values of Lbe of about 11-12 micrometers (e.g., Rbe~120 Ohms) and becomes saturated for Lbe values of about 23 micrometers and larger. Accordingly, Lbe distance 50 is usefully in the range of about 0.7 to 23 micrometers, more desirably in the range of about 1.0 to 15 micrometers, and preferably about at least 10-12 micrometers, but larger and smaller values can also be used. Varying Lbe can also be used to adjust the properties of ESD devices 56, 58 to suit particular situations. For example, for a given doping level in base portion 51, 75, smaller Lbe provides higher Vh and compact size but can lower It2. Larger Lbe provides higher It2 but can lower Vh. Thus, adjusting Lbe as well as base doping allows different combinations of ESD device properties to be selected to suit particular applications. This is useful.

Base portion 51 encompassing base contact region 77 and emitter 78 has doping usefully in the range of about 1E16 to 1E18 cm$^{-3}$ more conveniently in the range of about 4E16 to 4E17 cm$^{-3}$, and preferably in the range of about 4E16 to 8E16 cm$^{-3}$, but higher and lower values can also be used. Base portion 52 with boundary 752 has doping usefully in the range of about 1E17 to 1E18 cm$^{-3}$ and preferably in the range of about 4E17 to 8E17 cm$^{-3}$, but higher and lower values can also be used. Stated another way, base portion 51 has sheet resistance that is usefully at least about twice that of base portion 52, preferably in the range of about 2 to 20 times that of base portion 52. Stated still another way, the dopant concentration in base portion 51 proximate base contact 77, 77', 77R and emitter 78, 78', 78R versus the doping of base portion 52 proximate boundary 752, is usefully less than the doping of base portion 52, more conveniently less than about one half the doping of base portion 52 and as small as about one twentieth the doping of base portion 52. Stated yet another way, the doping of base portion 52 is at least twice that of base portion 51 and preferably as large as twenty times the doping of base portion 51. Depth 54 of base portion 51 below surface 71 can be larger or smaller than the depth of base portion 52, and is usefully in a range of about 0.5 to 2 micrometers.

That data in Tables I and II indicate that damage-onset threshold current It2 may be improved by adjusting the intrinsic base resistance Rbe in any of several ways, for example such as those described above. This beneficial effect is also obtained in multi-stack ESD devices. In general, it is preferred to similarly adjust Rbe of all devices in the stack, but in other embodiments, only some of the devices in the stack may be modified for this purpose, depending upon the design goals for the ESD stack. Either arrangement is useful.

When it is desired to increase Rbe merely by increasing Lbe, no changes in doping profiles are needed compared to what is described in connection with FIGS. 4, 9, 17 and 18-28. Manufacturing stages 118-128 of FIGS. 18-28 can be used as is and the adjustment in Lbe (and therefore in Rbe) made merely by adjusting spacing 501, 501' between openings 9421, 9422 and 9424, 9425, respectively, of blocking layer 941 of manufacturing stage 125 of FIG. 25, the number of such openings depending upon the number of devices in the ESD stack. Spacings 501, 501' determine Lbe distance 50, 50', 50R of FIGS. 27-28, 4, 9, 17, 29 and 30. By increasing distance 501, 501', distance Lbe can be correspondingly increased and the desired Lbe ranges (e.g., such as those illustrated above) readily achieved.

When it is desired to increase Rbe by decreasing the doping of, for example, base portion 51 of FIG. 29, thereby increasing the sheet resistance of base portion 51 of FIG. 29, several different manufacturing arrangements may be used. In one embodiment, base portion 51 of FIG. 29 may be formed by using the relatively lower background doping of EPI-2 region 74, 740 (see FIG. 20), which may be adjusted to provide the desired ESD properties. This is accomplished by limiting mask opening 912, 913 of FIG. 22 so that it does not extend over what will become base portion 51 of FIG. 29. In this embodiment, mask opening 912, 913 of FIG. 22 is laterally narrowed to correspond merely to portion 52 (75-1) of FIG.

Figure 30:
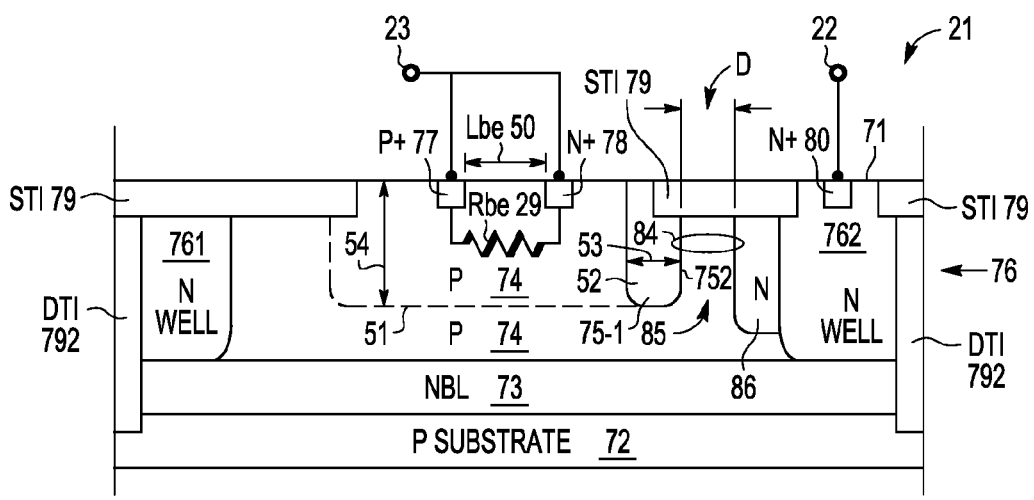

29, that is, (e.g., P type) WELL 75 of FIG. 22 encompasses only portion 52 (75-1) of FIG. 29. FIG. 30 is a simplified cross-sectional view of resulting ESD clamp 58 analogous to ESD clamps 40, 70, 99, 700, 56 previously described and suitable for use in the circuits of FIGS. 1-2, but according to the embodiment described here where base portion 51 of FIG. 29 (shown dashed in FIG. 30) is formed using the background doping of EPI-2 layer 74, 740 of FIG. 20 and WELL 75 of FIG. 22 corresponds just to portion 52 of FIG. 30, that is, to WELL region 75-1 in FIG. 30. Persons of skill in the art will understand that the doping of EPI-2 region 74, 740 of FIG. 20 may be adjusted with this embodiment in mind so as to provide the desired values of Rbe.

In another embodiment, where it is desired that region 51 of FIG. 29 have a doping different than that of EPI-2 layer 74, 740 of FIG. 20, for example, intermediate between the doping of Epi-2 layer 74, 740 and that illustrated above for base portion 52 (75-1). To accomplish this, manufacturing stage 122 of FIG. 22 may be altered as illustrated by way of example in manufacturing stages 122-1 and 122-2 of FIGS. 22-1 and 22-2. FIGS. 22-1 and 22-2 are simplified cross-sectional views of an ESD clamp of the type illustrated in FIG. 9 showing variations of manufacturing stage 122 of FIG. 22, according to additional embodiments of the present invention and showing further detail. In a preferred embodiment, manufacturing stage 122 of FIG. 22 comprising Implant B is replaced by manufacturing stage 122-1 comprising Implant B1 and manufacturing stage 122-2 comprising Implant B2. In manufacturing stage 122-1 of FIG. 22-1, mask 91-1 is provided on SC surface 71, having closed portions 911-1 and openings 912-1 and 913-1, suitable for defining WELL regions 51$i$, 51$i'$. A suffix "i" is used here to indicate that initial base portions 51$i$, 51$i'$ may differ in lateral extent from final base portions 51, 51' of FIG. 29. In a preferred embodiment, WELL region 51$i$, 51$i'$ may have the same lateral dimensions as WELL region 75, 75' of FIG. 22, and depth 54 may be the same as depth 751 of FIG. 22, but larger or smaller lateral dimensions and depths may also be used. However, the doping desired for base WELL region 51$i$, 51$i'$ resulting from Implant B1 of FIG. 22-1 is desirably smaller than that for WELL region 75 resulting from Implant B of FIG. 22. Region 51$i$, 51$i'$ is desirably implanted to provide a doping density in the range of about 1E16 to 1E18 cm$^{-3}$ and preferably in the range of about 4E16 to 8E16 cm$^{-3}$, but higher and lower doping may also be used. Structure 222-1 results.

Referring now to manufacturing stage 122-2 of FIG. 22-2, mask 91-1 of manufacturing stage 122-1 is replaced with mask 91-2 having closed portions 911-2 and openings 912-2, 913-2. Implant B2 is provided through openings 912-2, 913-2, so as to form base portions 52, 52' having doping density usefully in the range of about 1E17 to 1E18 cm$^{-3}$, preferably in the range of about 4E17 to 8E17 cm$^{-3}$, but higher and lower doping may also be used. Structure 222-2 results. In a preferred embodiment, other than geometry, Implant B2 can be similar to Implant B of FIG. 22 for providing region 75. Accordingly, in FIGS. 29-30, portion 52 is also identified as region 75-1.

In manufacturing step 122-1 of FIG. 22-1, mask openings 912-1 and 913-1 providing base portions 51$i$, 51$i'$ are shown as being wide enough to significantly overlap at least part of the location of mask openings 912-2 and 913-2 of manufacturing stage 122-2 of FIG. 22-2 providing base portions 52, 52'. While this is preferred since it simplifies alignment, it is not necessary and in still further embodiments, such overlap may be eliminated. In this configuration mask openings 912-1 and 913-1 of manufacturing stage 122-1 of FIG. 22-1 may be narrowed to eliminate some or all overlap with subsequently formed base portions 52, 52'. Then base portions 51$i$, 51$i$ correspond substantially to base portions 51, 51' substantially side-by-side with base portions 52, 52' rather than significantly overlapping base portions 52, 52'. Either arrangement is useful.

Having completed manufacturing stage 122-2, structure 222-2 is subjected to manufacturing stages 123-128 of FIGS. 23-28 keeping in mind the presence of base portions 51, 52, thereby yielding the structure illustrated in FIGS. 29 and 30 where base portion 51 has a different doping density (e.g., lighter), than the doping density of base portion 52. In a preferred embodiment, base portion 51 has doping density intermediate between the doping density of base portions 74, 85 formed from EPI-2 layer 74, 740 of FIG. 20 and the doping density of base portion 52. In this way, the resistance Rbe of transistor 56 is increased since the sheet resistance of base portion 51 is increased relative to base portion 52, thereby improving damage-onset threshold current It2. Because the doping density of base portion 52 is substantially unchanged, the improvement in It2 is achieved without significantly altering Vt1. Accordingly, a more robust ESD device having substantially the same threshold voltage Vt1 can be obtained in both single stage and multi-stage devices. This is very desirable. An advantage of modifying Rbe by changing the sheet resistance of base portion 51 is that no increase in ESD device area results. This is also desirable. While it is desirable to provide base portion 52 (e.g., of higher doping density) proximate boundary 752, in other embodiments such higher doping density base portion 52 may be omitted. In such cases, the doping density of WELL region 75 of FIGS. 4, 9, 17, etc., can be adjusted to provide the desired increase in Rbe and spacing D modified to achieve the desired Vt1 value in either single or multi-stack devices. Either arrangement is useful.

Persons of skill in the art will understand based on the teachings herein that Rbe (and therefore It2) can be increased by varying either the sheet resistance of base portion 51 (e.g., as illustrated in connection with FIGS. 29-30 and FIGS. 22-1, 22-2) or by increasing the sheet resistance of WELL portion 75 as a whole (e.g., as illustrated in FIGS. 4, 9, 17, etc.,) or by varying Lbe (e.g., as discussed in connection with FIGS. 25, 29, 22-1 and 22-2) or by a combination of such arrangements. Thus, the embodiments of the present invention illustrated herein provide a high degree of flexibility in improving ESD damage-onset threshold current It2 to obtain more robust ESD devices. This flexibility is very useful for tailoring ESD devices to suit specific applications and is a particular advantage of the present invention.

According to a first embodiment, there is provided an electrostatic discharge (ESD) clamp having a predetermined threshold voltage Vt1, comprising, a bipolar transistor (56, 58) having a first surface (71) and underlying the first surface (71) having a base (51, 52, 74, 75, 85) of a first conductivity type, a base contact (77) of the first conductivity type extending into the base (51, 52, 74, 75, 85) from the first surface (71), an emitter (78) of a second, opposite, conductivity type extending into the base (51, 52, 74, 75, 85) from the first surface (71) and laterally separated from the base contact (77) at the first surface (71) by a distance Lbe, and a collector (86, 762) proximate the base (51, 52, 74, 75, 85), wherein the base (51, 52, 74, 75, 85) comprises a first base portion (51) containing the base contact (77) and the emitter (78) and having a first base dopant concentration, a second base portion (52) located laterally between the first portion (51) and a first boundary (752) and having a second base dopant concentration, and a third base portion (85) of width D located laterally between the boundary (752) and a portion (86) of the collector (86, 762) and having a third base dopant concentration, wherein the threshold Vt1 is determined at least in part by the width D, and wherein the first base dopant concentration is less than or equal the second base dopant concentration. According to a further embodiment, Lbe is in the range of about 0.7 to 23 micrometers. According to a still further embodiment, Lbe is in the range of about 1 to 15 micrometers. According to a yet further embodiment, the first base portion (51) has a doping density in the range of about 1E16 to 1E18 cm$^{-3}$. According to a yet still further embodiment, the second base doping density is at least twice the first base doping density. According to another embodiment, the first base portion (51) has a first base sheet resistance and the second base portion (52) has a second base sheet resistance, and the first base sheet resistance is larger than the second base sheet resistance. According to still another embodiment, the first base sheet resistance is at least twice the second base sheet resistance. According to yet another embodiment, the first base sheet resistance is at least 2 to 20 times the second base sheet resistance. According to a still yet another embodiment, the transistor (56, 58) has a parasitic emitter-base resistance Rbe (29) in the range of 1≤Rbe≤800 Ohms According to a yet still another embodiment, the transistor (70) has a distance D=D1, and the ESD clamp (21) comprises a second transistor (70') analogous to the first transistor (70) but having a distance D'=D2 different than D1.

According to a second embodiment, there is provided a method for forming an ESD clamp (99, 100-105), comprising, providing a semiconductor substrate (72) of a first conductivity type and having an upper surface (71), forming at least one transistor (70) having a first well region (75, 51, 52) of a first conductivity type and first doping density extending into the substrate (72) from the first surface (71), the first well region (75, 51, 52) having a first lateral edge (752), forming in the at least one transistor (70) another well region (927) of a second opposite conductivity type extending into the substrate from the first surface (71), the another well region (927) forming part of a collector (27) of the transistor (70) and having another lateral edge (929) laterally separated from the first lateral edge (752) by a distance D adapted to determine in part a threshold voltage Vt1 of the ESD clamp (99, 100-105), forming in the first well region (52, 75) a base contact (77) of the first conductivity type and an emitter (78) of the second conductivity type separated by a lateral distance Lbe, and wherein the first doping density and the lateral distance Lbe are selected to provide a parasitic base-emitter resistance Rbe (29) in the range of 1≤Rbe≤800 Ohms According to a further embodiment, the first well region (51, 52, 75) has a first base portion (51) of a first base portion doping density and containing the base contact (77) and the emitter (78), and the first well region (51, 51, 75) also has a second base portion (52) of a second base portion doping density, located between the first base portion (51) and the first lateral edge (752), and the second base portion doping density is greater than the first base portion doping density. According to a yet further embodiment, the first base portion (51) has a first sheet resistance and the second base portion (52) has a second sheet resistance and the first sheet resistance is at least about twice the second sheet resistance. According to still yet further embodiment, the emitter (78) and the base contact region (77) are separated by a lateral distance Lbe in the range of about 0.7≤Lbe≤23 micrometers. According to a yet still further embodiment, the first base doping density is in the range of about 1E16 cm$^{-3}$ to 1E 18 cm$^{-3}$.

According to a third embodiment, there is provided an electrostatic discharge (ESD) protection clamp (21) for protecting a circuit core (24), comprising a bipolar transistor (56, 58) comprising a base region (74, 51, 52, 85) with a base contact (77) therein, an emitter (78) located in the base region (74, 51, 52, 85) spaced a lateral distance Lbe from the base contact (77), and a collector (80, 86, 762) proximate the base region (74, 51, 52, 85), wherein the base contact (77) and the emitter (78) are electrically coupled together and to a first terminal (23) of the clamp (21) and the collector (80, 86, 762) is electrically coupled to a second terminal (22) of the clamp (21) and the first (23) and second (22) terminals are adapted to be coupled across the circuit core (24), wherein the base region (74, 51, 52, 85) comprises a first portion (51) having a first doping density, the first portion (51) comprising the base contact (77) and the emitter (78) separated by a lateral distance Lbe, wherein the base region (74, 51, 52, 85) further comprises a second portion (52) having a second doping density, the second portion (52) having a lateral boundary (752) facing toward a portion (86, 762) of the collector (80, 86, 762), wherein the second portion (52) separates the first portion (51) from the lateral boundary (752), and wherein the first doping density is less than the second doping density. According to a further embodiment, the first doping density is less than or equal to one-half the second doping density. According to a still further embodiment, the second doping density is in the range of about 1E17 to 1E18 cm$^{-3}$. According to a yet further embodiment, the base region (74, 51, 52, 85) has a parasitic base-emitter resistance Rbe (29) in the range of about 1 to 800 Ohms. According to a yet further embodiment, Rbe (29) is in the range of about 2 to 240 Ohms.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming an electrostatic discharge protection (ESD) clamp, comprising:
    providing a semiconductor substrate of a first conductivity type and having an upper surface;
    forming at least one transistor having a first well region of a first conductivity type and first doping density extending into the substrate from the first surface, the first well region having a first lateral edge;
    forming, in the at least one transistor, another well region of a second opposite conductivity type extending into the substrate from the first surface, the another well region forming part of a collector of the transistor and having another lateral edge laterally separated from the first lateral edge by a distance D adapted to determine in part a threshold voltage Vt1 of the ESD clamp;
    forming in the first well region a base contact of the first conductivity type and an emitter of the second conductivity type separated by a lateral distance Lbe; and
    wherein the first doping density and the lateral distance Lbe are selected to provide a parasitic base-emitter resistance Rbe in the range of 1<Rbe<800 Ohms.

2. The method of claim 1 wherein Lbe is in the range of about 0.7<Lbe<23 micrometers.

3. The method of claim 1 wherein the first well region has a first base portion of a first base portion doping density and containing the base contact and the emitter, and wherein the first well region also has a second base portion of a second base portion doping density, located between the first base portion and the first lateral edge, and wherein the second base portion doping density is greater than the first base portion doping density.

4. The method of claim 3 wherein the first base portion has a first sheet resistance and the second base portion has a second sheet resistance and the first sheet resistance is at least about twice the second sheet resistance.

5. The method of claim 3 wherein the first base doping density is in the range of about $1E16\ cm^{-3}$ to $1E\ 18\ cm^{-3}$.

6. A method for forming an electrostatic discharge protection (ESD) clamp, comprising:
   providing a semiconductor substrate of a first conductivity type and having a first surface;
   producing on the semiconductor substrate at least a first bipolar transistor comprising:
      a first well region of a first conductivity type and first doping density extending into the substrate from the first surface, the first well region having a first lateral edge;
      another well region of a second opposite conductivity type extending into the substrate from the first surface, the another well region forming part of a collector of the transistor and having another lateral edge laterally separated from the first lateral edge by a distance D adapted to determine in part a threshold voltage Vt1 of the ESD clamp;
      a base contact of the first conductivity type extending into the first well region from the first surface; and
      an emitter of a second, opposite conductivity type extending into the first well region from the first surface and laterally separated from the base contact at the first surface by a distance Lbe between about 0.7 and 23 micrometers.

7. The method of claim 6 wherein Lbe is in the range of about 1 to 15 micrometers.

8. The method of claim 6 wherein the transistor has a parasitic emitter-base resistance Rbe in the range of about 1 to about 800 Ohms.

9. The method of claim 6 further comprising:
   a first base portion formed in the first well region and containing the base contact and the emitter; and
   a second base portion formed in the first well region and located laterally between the first base portion and the first lateral edge, the second base portion having a dopant concentration greater than the first base portion.

10. The method of claim 9 wherein the first base portion has a doping density in the range of about 1E16 to $1E18\ cm^{-3}$.

11. The method of claim 9 wherein doping density of the second base portion is at least twice the doping density of the first base portion.

12. The method of claim 9 wherein the first base portion has a first base sheet resistance, and wherein the second base portion has a second base sheet resistance less than the first base sheet resistance.

13. The method of claim 12 wherein the first base sheet resistance is at least twice the second base sheet resistance.

14. A method for forming an electrostatic discharge protection (ESD) clamp, comprising:
   providing a semiconductor substrate of a first conductivity type and having a first surface;
   producing on the semiconductor substrate at least a first bipolar transistor comprising:
      a first well region of a first conductivity type and first doping density extending into the substrate from the first surface, the first well region having a first lateral edge;
      another well region of a second opposite conductivity type extending into the substrate from the upper surface, the another well region forming part of a collector of the transistor and having another lateral edge laterally separated from the first lateral edge by a distance D adapted to determine in part a threshold voltage Vt1 of the ESD clamp;
      a first base portion formed in the first well region; and
      a second base portion formed in the first well region between the first base portion and the first lateral edge;
   wherein the first base portion has a dopant concentration less than the dopant concentration of the second base portion and a sheet resistance greater than the sheet resistance of the second base portion.

15. The method of claim 14 wherein the base sheet resistance of the first base portion is at least 2 to 20 times the base sheet resistance of the second base portion.

16. The method of claim 14 wherein the first base portion has a doping density in the range of about 1E16 to $1E18\ cm^{-3}$.

17. The method of claim 14 wherein the second base portion has a doping density at least twice that of the first base portion.

18. The method of claim 14 wherein the first bipolar transistor has a parasitic emitter-base resistance Rbe in the range of 1<Rbe<800 Ohms.

19. The method of claim 14 further comprising:
   a base contact of the first conductivity type extending into the first base portion from the first surface; and
   an emitter of a second, opposite conductivity type extending into the first base portion from the first surface and laterally separated from the base contact at the first surface by a distance Lbe.

20. The method of claim 19 wherein Lbe is in the range of about 0.7<Lbe<23 micrometers.

* * * * *